US011237021B2

(12) United States Patent
Mori et al.

(10) Patent No.: US 11,237,021 B2
(45) Date of Patent: Feb. 1, 2022

(54) FAILURE DETERMINATION DEVICE FOR ROTATING MACHINE CONTROL DEVICE AND FAILURE DETERMINATION METHOD

(71) Applicant: Mitsubishi Electric Corporation, Tokyo (JP)

(72) Inventors: Tatsuya Mori, Tokyo (JP); Isao Kezobo, Tokyo (JP); Munenori Yamamoto, Tokyo (JP); Akira Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 488 days.

(21) Appl. No.: 16/085,668

(22) PCT Filed: Apr. 28, 2016

(86) PCT No.: PCT/JP2016/063358
§ 371 (c)(1),
(2) Date: Sep. 17, 2018

(87) PCT Pub. No.: WO2017/187599
PCT Pub. Date: Nov. 2, 2017

(65) Prior Publication Data
US 2020/0300671 A1    Sep. 24, 2020

(51) Int. Cl.
*G01D 5/244*        (2006.01)
*H02P 29/024*       (2016.01)
(Continued)

(52) U.S. Cl.
CPC ......... *G01D 5/24457* (2013.01); *G01R 31/42* (2013.01); *G01R 35/00* (2013.01); *H02P 29/024* (2013.01); *H02P 27/06* (2013.01)

(58) Field of Classification Search
CPC .... G01D 5/24457; G01R 31/42; G01R 35/00; H02P 29/024; H02P 27/06; B62D 5/0463
See application file for complete search history.

(56) References Cited

U.S. PATENT DOCUMENTS

2007/0233345 A1 * 10/2007 Endo .................. B62D 15/0215
                                                    701/41
2013/0200827 A1    8/2013 Kezobo et al.
(Continued)

FOREIGN PATENT DOCUMENTS

EP          2566045 A2    3/2013
JP       2005-335591 A    12/2005
(Continued)

OTHER PUBLICATIONS

International Search Report for PCT/JP2016/063358 dated Jul. 26, 2016 [PCT/ISA/210].
(Continued)

*Primary Examiner* — Clayton E. LaBalle
*Assistant Examiner* — Michael A Harrison
(74) *Attorney, Agent, or Firm* — Sughrue Mion, PLLC; Richard C. Turner

(57) ABSTRACT

Provided are a failure determination device and method for a rotating machine control device, which are capable of detecting failure of a sensor configured to detect a rotational position of a rotating machine while the rotating machine is in operation. A rotation angle estimator calculates a rotation angle estimation value. A relationship between the rotation angle estimation value ($\theta$est), and a first angle detection value ($\theta 1$) and a second angle detection value ($\theta 2$), which are obtained from output signals of angle sensors configured to detect a rotational position of a rotating machine, is monitored while the rotating machine is in operation. In this manner, failure of the angle sensors, which are configured to detect the rotational position of the rotating machine, can be always detected even while the rotating machine is in operation.

17 Claims, 36 Drawing Sheets

(51) Int. Cl.
*G01R 31/42* (2006.01)
*G01R 35/00* (2006.01)
H02P 27/06 (2006.01)

(56) References Cited

U.S. PATENT DOCUMENTS

2016/0167701 A1\* 6/2016 Sone .................. G01L 3/12
                                                                                                701/43
2019/0039645 A1\* 2/2019 Kuwahara ............ B62D 15/021

FOREIGN PATENT DOCUMENTS

| JP | 2007-336756 A | 12/2007 |
| JP | 2011-239563 A | 11/2011 |
| JP | 2013-162680 A | 8/2013 |
| WO | 2015/125235 A1 | 8/2015 |

OTHER PUBLICATIONS

Communication dated Mar. 14, 2019 from the European Patent Office in application No. 16900469.4.

\* cited by examiner

FAILURE DETERMINATION DEVICE FOR ROTATING MACHINE CONTROL DEVICE AND FAILURE DETERMINATION METHOD

CROSS REFERENCE TO RELATED APPLICATIONS

This application is a National Stage of International Application No. PCT/JP2016/063358 filed Apr. 28, 2016.

TECHNICAL FIELD

The present invention relates to a failure determination device and method for a rotating machine control device.

BACKGROUND ART

In Patent Literature 1, there are described an electric motor control method and an electric motor control device including: magnetic pole position estimation means for estimating a rotor magnetic pole position of an electric motor by supplying, to the electric motor including a rotor having an electrical saliency, a high frequency voltage or current for detecting the rotor magnetic pole position to measure a response current or voltage of the electric motor; a magnetic pole position sensor configured to detect a magnetic pole position of the electric motor; magnetic pole position detection means for obtaining the magnetic pole position from an output signal of the magnetic pole position sensor; initial position correction means for obtaining a difference between a magnetic pole position estimation value from the magnetic pole position estimation means and the magnetic pole position obtained by the magnetic pole position detection means to provide the difference as a correction value; and an inverter configured to correct a magnetic pole position signal obtained from the magnetic pole position detection means with use of the correction value provided from the correction means, to thereby control drive of the electric motor based on the corrected magnetic pole position.

CITATION LIST

Patent Literature

[PTL 1] JP 2011-239563 A, paragraph 0006

SUMMARY OF INVENTION

Technical Problem

As in the above-mentioned related art, an influence of an initial positional misalignment at the time when the magnetic pole position sensor is mounted can be reduced by using the magnetic pole position estimation value, but when failure occurs in the magnetic pole position sensor while the electric motor is in operation, an error may occur between the magnetic pole position obtained from the sensor and the true magnetic pole position of the electric motor. Thus, the electric motor may become uncontrollable.

The present invention has been made to solve the above-mentioned problem, and has an object to provide a failure determination device and method for a rotating machine control device, which are capable of detecting failure of a sensor configured to detect a rotational position of a rotating machine including an electric motor while the rotating machine is in operation.

Solution to Problem

According to one embodiment of the present invention, there is provided, for example, a failure determination device for a rotating machine control device, the failure determination device including: a power converter configured to supply power to a rotating machine; a current detector configured to detect a rotating machine current to be supplied to the rotating machine; a first angle sensor configured to generate at least two electrical signals in accordance with a rotation angle of the rotating machine; a first sine wave signal output device configured to output a first sine wave signal and a second sine wave signal based on the at least two electrical signals generated by the first angle sensor; a first angle calculator configured to output a first angle detection value based on the first sine wave signal and the second sine wave signal; a second angle sensor configured to generate at least two electrical signals in accordance with the rotation angle of the rotating machine; a second sine wave signal output device configured to output a third sine wave signal and a fourth sine wave signal based on the at least two electrical signals generated by the second angle sensor; a second angle calculator configured to output a second angle detection value based on the third sine wave signal and the fourth sine wave signal; a rotation angle estimator configured to output a rotation angle estimation value with respect to the rotation angle of the rotating machine based on the rotating machine current; and an angle sensor failure determiner configured to detect failure of the first angle sensor and the second angle sensor, the angle sensor failure determiner being configured to determine the failure of the first angle sensor or the second angle sensor based on at least two of: a difference between the rotation angle estimation value and the first angle detection value; a difference between the rotation angle estimation value and the second angle detection value; and a difference between the first angle detection value and the second angle detection value.

Advantageous Effects of Invention

According to one embodiment of the present invention, it is possible to provide the failure determination device and method for a rotating machine control device, which are capable of detecting failure of the sensor configured to detect the rotational position of the rotating machine including the electric motor while the rotating machine is in operation.

DESCRIPTION OF EMBODIMENTS

In the present invention, a rotation angle estimator calculates a rotation angle estimation value. A relationship between the rotation angle estimation value, and a first angle detection value and a second angle detection value, which are obtained from output signals of angle sensors configured to detect a rotational position of a rotating machine, is monitored while the rotating machine is in operation. In this manner, failure of the angle sensors, which are configured to detect the rotational position of the rotating machine, can be always detected even while the rotating machine is in operation.

Now, a failure determination device and method for rotating machine control device according to the present invention are described with reference to the drawings by way of embodiments. In the embodiments, like or corresponding parts are denoted by like symbols, and redundant description is omitted.

First Embodiment

Figure 1:
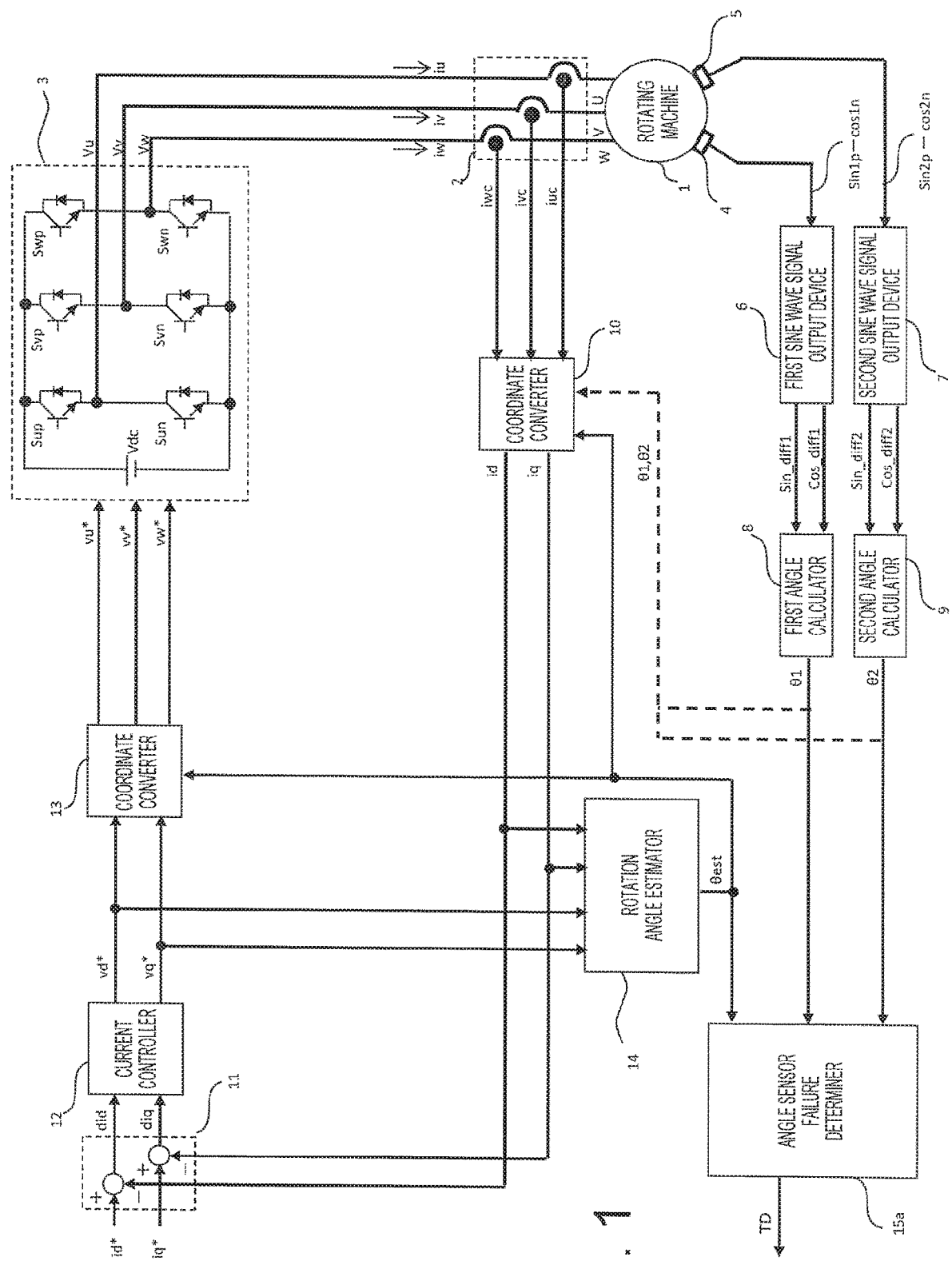
FIG. 1 is a diagram for illustrating an example of a configuration of a rotating machine control device including a failure determination device according to first to third embodiments of the present invention.

FIG. 1 is a diagram for illustrating an example of a configuration of a rotating machine control device including a failure determination device according to first to third embodiments of the present invention. In FIG. 1, a rotating machine 1 is an AC rotating machine, and is, for example, a synchronous rotating machine including three-phase windings U, V, and W. Although not shown in FIG. 1, a rotor is a structure for causing permanent magnets or a field winding to generate magnetic fluxes.

A current detector 2 uses current detectors such as shunt resistors or Hall elements to detect rotating machine phase currents iu, iv, and iw, which are currents flowing through the three-phase windings U, V, and VV of the rotating machine 1, respectively. Detection values of iu, iv, and iw are represented by iuc, ivc, and iwc, respectively.

An inverter 3 serving as a power converter is a multi-phase inverter, and is a three-phase inverter in this case. The inverter 3 subjects a DC voltage Vdc to PWM modulation at a carrier period Tc (for example, 50 μs) in accordance with three-phase voltage commands vu*, vv*, and vw* to be described later to apply voltages Vu, Vv, and Vw to the three-phase windings U, V, and W of the rotating machine 1, respectively. As each of switching elements Sup to Swn, a switch obtained by connecting a semiconductor switch such as an IGBT, a bipolar transistor, or a MOS power transistor and a diode in antiparallel is used.

Figure 2:
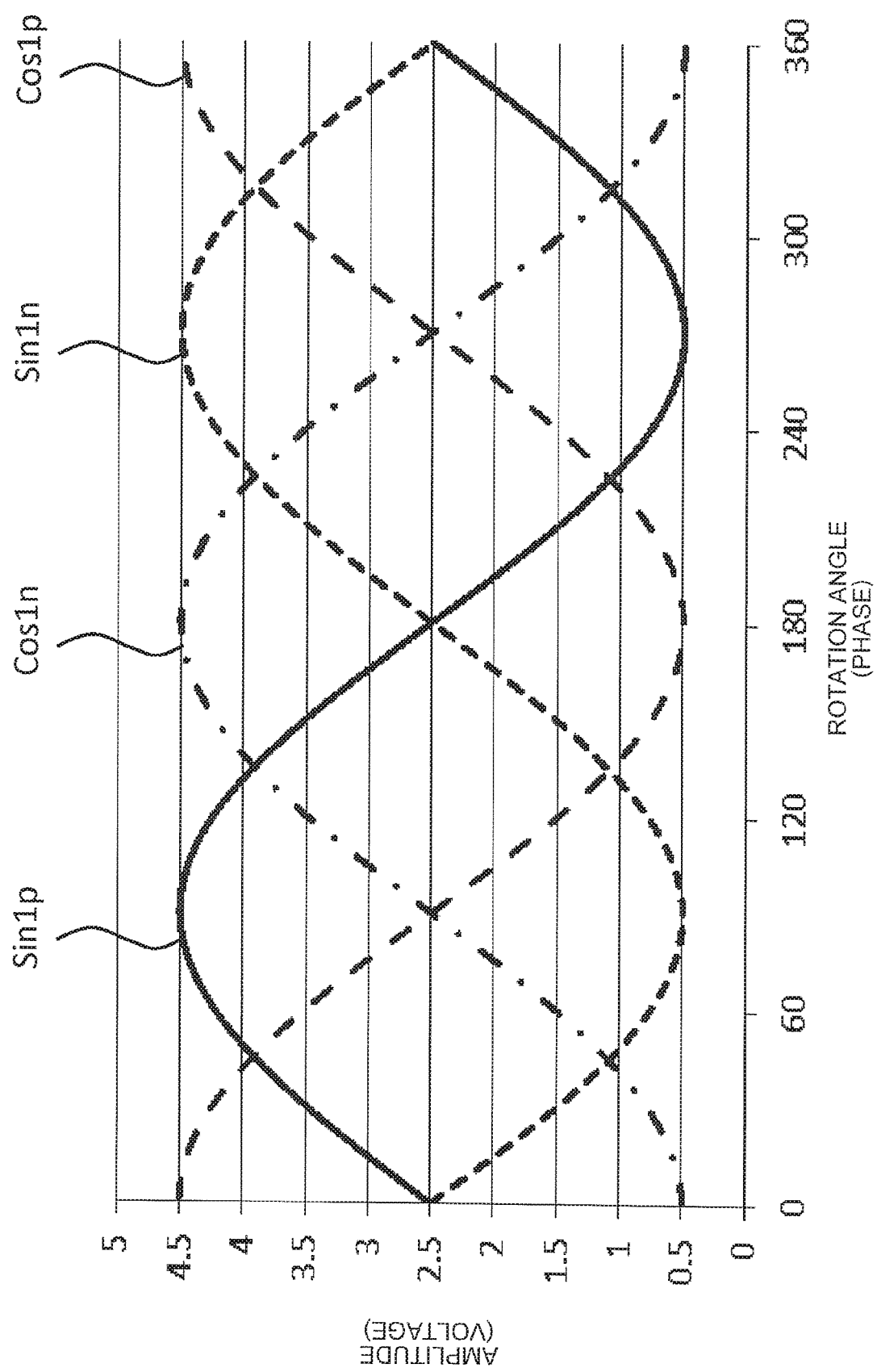
FIG. 2 is a graph for showing output signals of a first angle sensor of FIG. 1.

A first angle sensor 4 is a position detector, for example, a Hall element, a TMR element, or a GMR element. In order to obtain a rotational position of the rotating machine 1, the first angle sensor 4 outputs four electrical signals including two sine signals and two cosine signals as shown in FIG. 2. The sine signals include a sine signal 1 (Sin1p) and a sine signal 2 (Sin1n) having a phase that is different by 180° from that of the sine signal 1. The cosine signals includes a cosine signal 1 (Cos1p) and a cosine signal 2 (Cos1n) having a phase that is different by 180° from that of the cosine signal 1.

Figure 3:
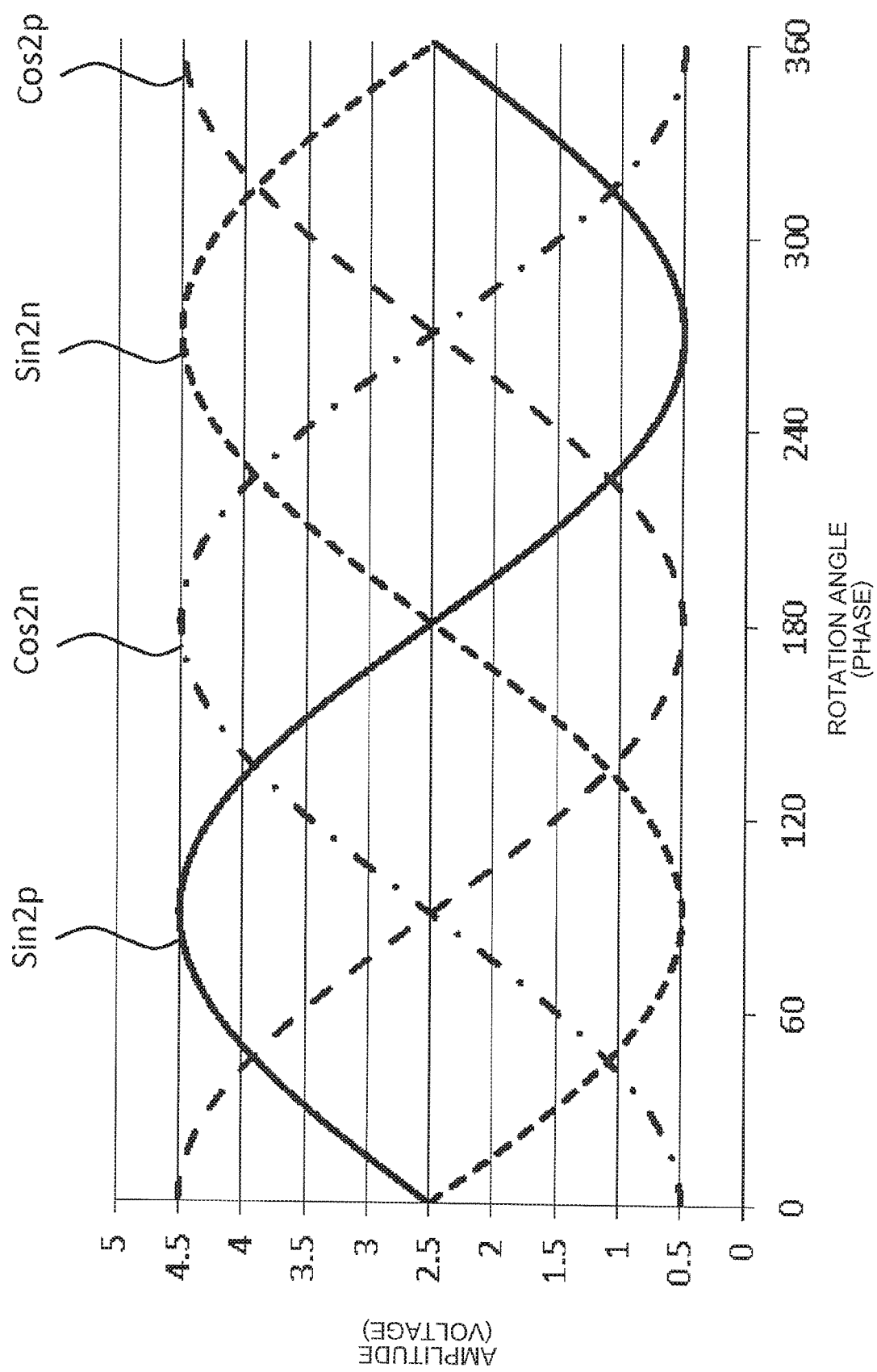
FIG. 3 is a graph for showing output signals of a second angle sensor of FIG. 1.

A second angle sensor 5 is a position detector, for example, a Hall element, a TMR element, or a GMR element. In order to obtain a rotational position of the rotating machine 1, the first angle sensor 4 outputs four electrical signals including two sine signals and two cosine signals as shown in FIG. 3. The sine signals include a sine signal 3 (Sin2p) and a sine signal 4 (Sin2n) having a phase that is different by 180° from that of the sine signal 3. The cosine signals includes a cosine signal 3 (Cos2p) and a cosine signal 4 (Cos2n) having a phase that is different by 180° from that of the cosine signal 3.

The sine signal 1 (Sin1p), the sine signal 2 (Sin1n), the cosine signal 1 (Cos1p), and the cosine signal 2 (Cos1n) are referred to as "first to fourth electrical signals", and the sine signal 3 (Sin2p), the sine signal 4 (Sin2n), the cosine signal 3 (Cos2p), and the cosine signal 4 (Cos2n) are referred to as "fifth to eighth electrical signals".

Further, each sine signal is also referred to as "sine wave signal", and each cosine signal is also referred to as "cosine wave signal".

A first sine wave signal output device 6 calculates a first sine wave signal Sin_diff1 and a second sine wave signal Cos_diff1 from the four electrical signals output from the first angle sensor 4 based on Expression (1).

$$\begin{cases} \text{Sin\_diff1} = \text{Sin}1p - \text{Sin}1n \\ \text{Cos\_diff1} = \text{Cos}1p - \text{Cos}1n \end{cases} \quad (1)$$

A second sine wave signal output device 7 calculates a third sine wave signal Sin_diff2 and a fourth sine wave signal Cos_diff2 from the four electrical signals output from the second angle sensor 5 based on Expression (2).

$$\begin{cases} \text{Sin\_diff1} = \text{Sin}2p - \text{Sin}2n \\ \text{Cos\_diff1} = \text{Cos}2p - \text{Cos}2n \end{cases} \quad (2)$$

Further, each of the second and fourth sine wave signal is also referred to as "cosine wave signal". Further, each of the first to fourth sine wave signal is also referred to as "sine wave difference signal", and each of the second and fourth sine wave signal is also referred to as "cosine wave difference signal".

A first angle calculator 8 generates a first angle detection value θ1 based on the first sine wave signal Sin_diff1 and the second sine wave signal Cos_diff1 obtained from the first sine wave signal output device 6. For example, the first angle detection value θ1 is calculated as in Expression (3).

$$\theta_1 = \arctan\left(\frac{\text{Sin\_diff1}}{\text{Cos\_diff1}}\right) \quad (3)$$

A second angle calculator 9 generates a second angle detection value θ2 based on the third sine wave signal Sin_diff2 and the fourth sine wave signal Cos_diff2 obtained from the second sine wave signal output device 7. For example, the second angle detection value θ2 is calculated as in Expression (4).

$$\theta_2 = \arctan\left(\frac{\text{Sin\_diff2}}{\text{Cos\_diff2}}\right) \quad (4)$$

A first coordinate converter 10 calculates rotating machine currents id and iq on two rotational axes (d-q axes) based on the rotating machine phase current detection values iuc, ivc, and iwc detected by the current detector 2 and a rotation angle estimation value θest indicating an estimated rotational position to be described later. Needless to say, the first angle detection value θ1 and the second angle detection value θ2 may be used for calculation instead of the rotation angle estimation value θest.

A subtractor 11 subtracts the rotating machine currents id and iq on the two rotational axes (d-q axes), which are obtained from the coordinate converter 10, from current commands id* and iq*, respectively, to output deviations did (=id*-id) and diq (=iq*-iq).

A current controller 12 calculates voltage commands vd* and vq* on the two rotational axes (d-q axes) through proportional-integral control or proportional control so that both of the deviations did (=id*-id) and diq (=iq*-iq) obtained from the subtractor 11 match 0.

A second coordinate converter 13 calculates the voltage commands vu*, vv*, and vw* on three-phase coordinates from the voltage commands vd* and vq* on the two rotational axes (d-q axes) obtained from the current controller 12.

A rotation angle estimator 14 outputs the rotation angle estimation value θest based on:
- a d-axis voltage Vd on the two rotational axes (d-q axes) obtained from the voltage command vd*;
- a q-axis voltage Vq on the two rotational axes (d-q axes) obtained from the voltage command vq*;
- a d-axis current Id and a q-axis current Iq on the two rotational axes (d-q axes) obtained from the rotating machine currents id and iq, respectively; and electrical constants of the rotating machine 1 including a winding resistance R, inductances Ld and Lq, and a flux interlinkage number Φ.

Now, details of the rotation angle estimator 14 are described. The voltage equations on the d-q axes of the rotating machine 1 in the first embodiment are represented as Expressions (5) and (6).

$$\begin{bmatrix} v_d \\ v_q \end{bmatrix} = \begin{bmatrix} R + pL_d & -\omega L_q \\ \omega L_d & R + pL_q \end{bmatrix} \begin{bmatrix} i_d \\ i_q \end{bmatrix} + \begin{bmatrix} 0 \\ \omega\phi \end{bmatrix} \text{(when } \Delta\theta = 0\text{)} \quad (5)$$

$$\begin{bmatrix} v_d \\ v_q \end{bmatrix} = \begin{bmatrix} R + pL_d & -\omega L_q \\ \omega L_d & R + pL_q \end{bmatrix} \begin{bmatrix} i_d \\ i_q \end{bmatrix} + \begin{bmatrix} -\omega\phi\sin(\Delta\theta) \\ \omega\phi\cos(\Delta\theta) \end{bmatrix} \quad (6)$$

(when $\Delta\theta \neq 0$)

In Expressions (5) and (6):

Δθ represents a rotation angle estimation error calculated by subtracting a true rotation angle θ of the AC rotating machine 1 from the rotation angle estimation value θest; and ω represents a rotation angular velocity.

Further, symbols are defined as follows, vd: d-axis voltage
vq: q-axis voltage
id: d-axis current
iq: q-axis current
R: winding resistance
Ld: d-axis inductance
Lq: q-axis inductance
p: differential operator
Φ: flux interlinkage number Next, when the voltages and the currents are represented by a d-axis voltage vd(n), a q-axis voltage vq(n), a d-axis current id(n), and a q-axis current iq(n) with use of a sample number n, and a rotation angular velocity estimation value is represented by ωest, Expression (5) can be expressed as in Expression (8) through approximation of Expression (7).

$$\frac{di}{dt} = \frac{i(n) - i(n-1)}{T_c} \quad (7)$$

$$\begin{bmatrix} i_{d\_cal}(n) \\ i_{q\_cal}(n) \end{bmatrix} = \begin{bmatrix} 1 - \frac{R}{L_d}T_c & -\omega_{est}\frac{L_q}{L_d}T_c \\ -\omega_{est}\frac{L_d}{L_q}T_c & 1 - \frac{R}{L_q}T_c \end{bmatrix} \begin{bmatrix} i_d(n-1) \\ i_q(n-1) \end{bmatrix} + \frac{T_c}{L_d L_q} \left[ \begin{bmatrix} L_q V_q(n-1) \\ L_d V_q(n-1) \end{bmatrix} - \begin{bmatrix} 0 \\ L_d \omega_{est}\phi \end{bmatrix} \right] \quad (8)$$

Tc represents a calculation period.

Next, Expression (9) can be obtained by applying approximation of Expression (7) to Expression (6).

$$\begin{bmatrix} i_d(n) \\ i_q(n) \end{bmatrix} = \begin{bmatrix} 1 - \frac{R}{L_d}T_c & -\omega\frac{L_q}{L_d}T_c \\ -\omega\frac{L_d}{L_q}T_c & 1 - \frac{R}{L_q}T_c \end{bmatrix} \begin{bmatrix} i_d(n-1) \\ i_q(n-1) \end{bmatrix} + \frac{T_c}{L_d L_q} \left[ \begin{bmatrix} L_q V_q(n-1) \\ L_d V_q(n-1) \end{bmatrix} - \omega\phi \begin{bmatrix} -L_q\sin(\Delta\theta) \\ L_d\cos(\Delta\theta) \end{bmatrix} \right] \quad (9)$$

Next, Expression (10) can be obtained by subtracting Expression (8) from Expression (9).

$$\begin{bmatrix} \Delta i_d(n) \\ \Delta i_q(n) \end{bmatrix} = \begin{bmatrix} i_d(n) - i_{d\_cal}(n) \\ i_q(n) - i_{q\_cal}(n) \end{bmatrix} = \frac{\phi T_c}{L_d L_q} \begin{bmatrix} \omega L_q \sin(\Delta\theta) \\ \omega_{est} L_d - \omega L_d \cos(\Delta\theta) \end{bmatrix} \approx \frac{\phi T_c}{L_d L_q} \begin{bmatrix} \omega L_q \Delta\theta \\ L_d \Delta\omega \end{bmatrix} \quad (10)$$

Assuming that Δθ≈0, approximation of sin(Δθ)≈Δθ and cos(Δθ)≈1 is used to obtain (rotation angular velocity estimation error Δω)=ωest-ω. Referring to Expression (10), a d-axis current error Δid(n) is proportional to the rotation angle estimation error Δθ, and a q-axis current error Δiq(n) is proportional to the rotation angular velocity estimation error Δω.

Referring to Expression (8) to Expression (10), estimation calculation performed by the rotation angle estimator 14 is described. Expression (8) represents a d-axis current id_cal(n) and a q-axis current iq_cal(n) calculated with use of a d-axis voltage vd(n−1), a q-axis voltage vq(n−1), a d-axis current id(n−1), and a q-axis current iq(n−1), which are (n−1)-th sample values, and the rotation angular velocity estimation value ωest. Expression (8) is derived based on Δθ=0 and ωest=ω, and hence when Δθ=0 and ωest=ω are satisfied, id_cal(n) and iq_cal(n) on the left side match the d-axis current id(n) and the q-axis sum current iq(n), respectively. When ωest≠ω is satisfied, no matching occurs. Meanwhile, when the d-axis voltage vd(n−1) and the q-axis voltage vq(n−1) are applied to the rotating machine 1, in accordance with Expression (9), the d-axis current id(n) and the q-axis current iq(n) are determined based on the current detection values detected by the current detector 2.

Therefore, in the rotation angle estimator 14, id_cal(n) and iq_cal(n) are calculated with use of Expression (8) based on the d-axis voltage vd(n−1), the q-axis voltage vq(n−1), the d-axis current id(n−1), the q-axis current iq(n−1), and the rotation angular velocity estimation value ωest. Differences between those values and the d-axis current id(n) and the q-axis current iq(n) input from the first coordinate converter 10 are calculated in accordance with Expression (10). Thus, Δid(n) is controlled to be 0 to converge the rotation angle estimation error Δθ, which is a rotational position error, to 0, and Δiq(n) is controlled to be 0 to converge the rotation angular velocity estimation error Δω to 0.

Description has been given above of an example in which the rotation angle estimator 14 obtains the rotation angle estimation value θest based on the voltage commands vd* and vq* and the rotating machine currents id and iq, but when the voltage equations of the rotating machine 1 can be expressed by Expressions (5) and (6), a known technology of superimposing high frequency components to the voltage commands and extracting the components included in the rotating machine currents to calculate the rotation angle estimation value θest may be used. In this case, the input values of the rotation angle estimator 14 are the rotating machine currents, and the output is the rotation angle estimation value θest. Further, even when the rotating machine 1 is an induction motor, a known method may be used to obtain the rotation angle estimation value θest.

Figure 4:
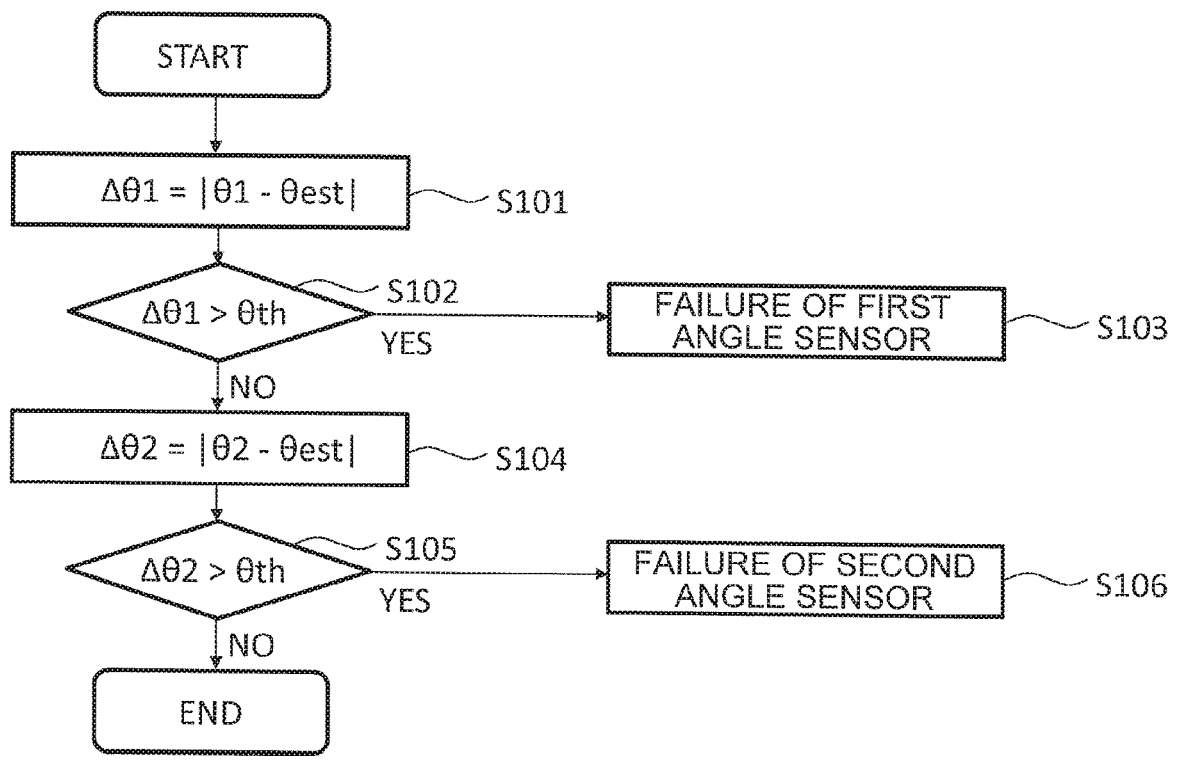
FIG. 4 is a flow chart for illustrating an example of an operation of an angle sensor failure determiner in the first embodiment of the present invention.

Subsequently, an angle sensor failure determiner 15a is described. FIG. 4 is a flow chart for illustrating the calculation operation of the angle sensor failure determiner 15a. In Step S101, an absolute value of a difference between the first angle detection value θ1 and the rotation angle estimation value θest is calculated, and the result is represented by Δθ1. In Step S102, Δθ1 is compared with a first angle deviation threshold value θth. When Δθ1 is larger than θth, Step S103 is executed, and otherwise, Step S104 is executed. In this case, the first angle deviation threshold value θth is, for example, a predetermined setting value that falls within 90 degrees in electrical angle of the rotating machine 1. In Step S103, it is determined that the first angle sensor 4 is out of order.

In Step S104, an absolute value of a difference between the second angle detection value θ2 and the rotation angle estimation value θest is calculated, and the result is represented by Δθ2. In Step S105, Δθ2 is compared with the first angle deviation threshold value θth. When Δθ2 is larger than θth, Step S106 is executed, and otherwise, the processing is ended. In Step S106, it is determined that the second angle sensor 5 is out of order.

When the angle sensor failure determiner 15a determines the failure, the angle sensor failure determiner 15a outputs a failure determination signal TD indicating, for example, the occurrence of the failure and in which angle sensor the failure has occurred.

As described above, according to the first embodiment, the failure of the first angle sensor is determined based on the difference between the rotation angle estimation value obtained by the rotation angle estimator and the first angle detection value, and the failure of the second angle sensor is determined based on the difference between the rotation angle estimation value obtained by the rotation angle estimator and the second angle detection value. In this manner, such a remarkable effect that is not provided in the related art that the failure of the first angle sensor and the second angle sensor can be detected even while the rotating machine 1 is in operation can be obtained.

Figure 39:
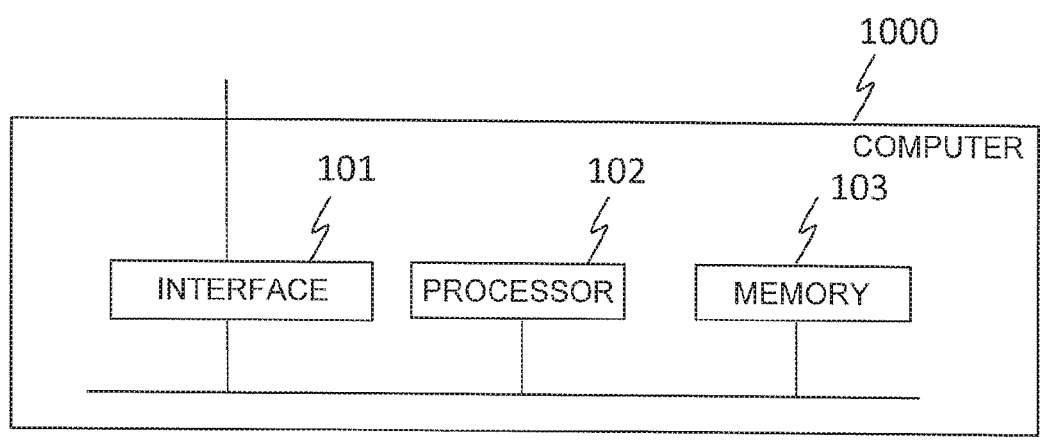
FIG. 39 is a diagram for illustrating an example of a schematic configuration of a case in which main parts of the failure determination device for a rotating machine control device according to the present invention are formed of a computer.

Parts other than the inverter 3, the current detector 2, the rotating machine 1, and the first and second angle sensors 4 and 5 of FIG. 1 can be formed of one computer, for example. An example of a schematic configuration of the computer in this case is illustrated in FIG. 39.

In a computer 1000, input or output of input signals from the current detector 2, the first and second angle sensors 4 and 5, the outside, and the like and output signals including the failure determination signal TD is performed via an interface 101. In a memory 103, programs of various functions for respective parts illustrated as functional blocks in FIG. 1 and functional parts defined in the description, information required for processing, and data including various setting values are to be stored or stored in advance. A processor 102 subjects the signal input via the interface 101 to calculation processing in accordance with the various programs, information, and data stored in the memory 103 to output the processing results via the interface 101.

Further, the above-mentioned various functions may be formed of one digital circuit, or may be formed of digital circuits for respective appropriate functions.

In each of the embodiments described below, the parts can be similarly formed of a computer as described above.

Second Embodiment

A configuration of a rotating machine control device including a failure determination device according to a second embodiment of the present invention is basically the same as that of FIG. 1, but the processing in the angle sensor failure determiner 15a differs.

Figure 5:
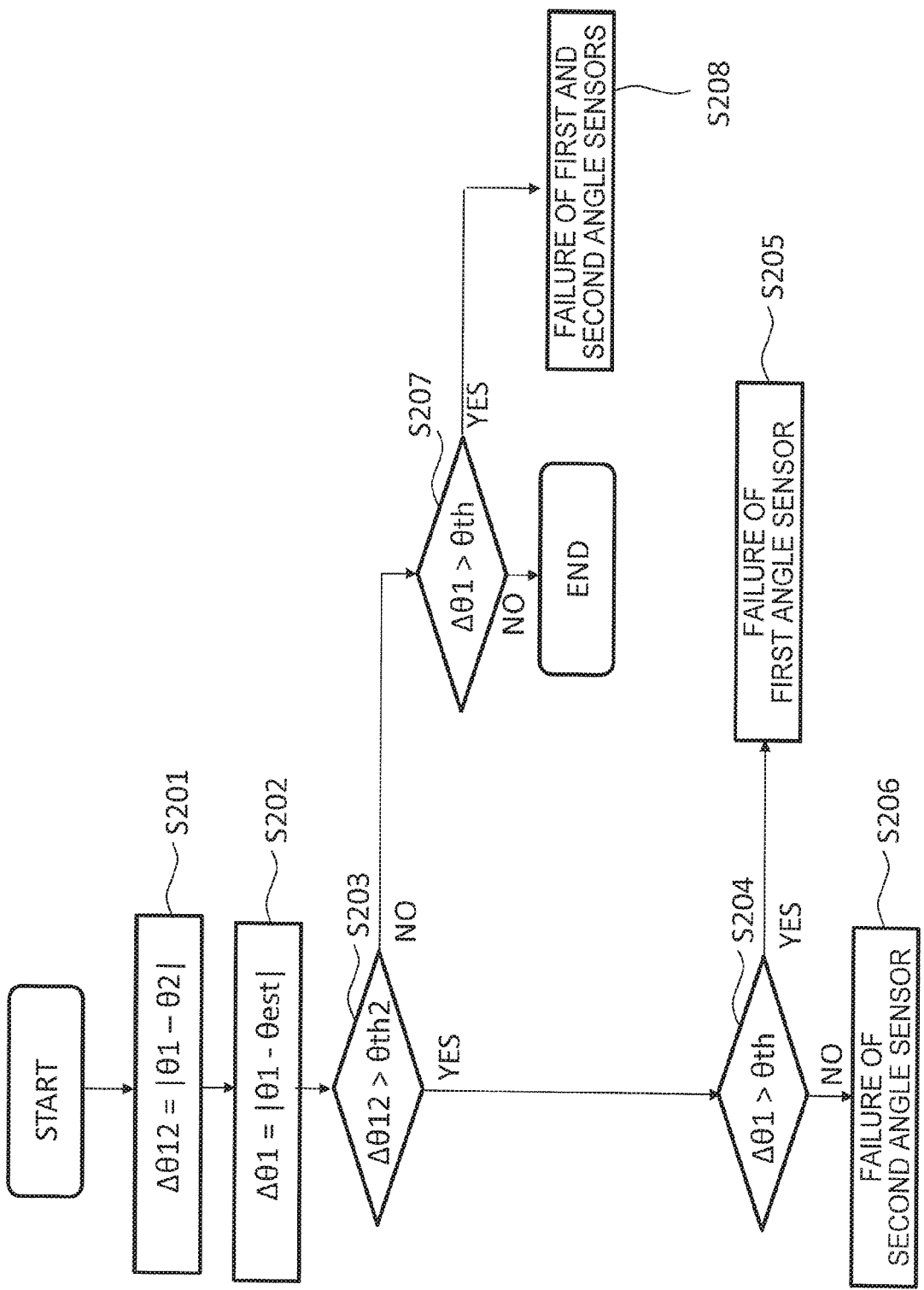
FIG. 5 is a flow chart for illustrating an example of an operation of an angle sensor failure determiner in the second embodiment of the present invention.

FIG. 5 is a flow chart for illustrating the calculation operation of the angle sensor failure determiner 15a in the second embodiment.

In Step S201, an absolute value of a difference between the first angle detection value θ1 and the second angle detection value θ2 is calculated, and the result is represented by Δθ12.

In Step S202, the absolute value of the difference between the first angle detection value θ1 and the rotation angle estimation value θest is calculated, and the result is represented by Δθ1.

In Step S203, Δθ12 is compared with a second angle deviation threshold value θth2. When Δθ12 is larger than the second angle deviation threshold value θth2, Step S204 is executed, and otherwise, Step S207 is executed.

In Step S204, Δθ1 is compared with the first angle deviation threshold value θth. When Δθ1 is larger than the first angle deviation threshold value θth, Step S205 is executed, and otherwise, Step S206 is executed.

In Step S205, it is determined that the first angle sensor 4 is out of order, and in Step S206, it is determined that the second angle sensor 5 is out of order.

In Step S207, Δθ1 is compared with the first angle deviation threshold value θth. When Δθ1 is larger than the first angle deviation threshold value θth, Step S208 is executed, and otherwise, the processing is ended.

In Step S208, it is determined that both of the first angle sensor 4 and the second angle sensor 5 are out of order.

The first angle deviation threshold value θth and the second angle deviation threshold value θth2 may be a common value.

As described above, according to the second embodiment, the failure of the first angle sensor and the second angle sensor can be detected based on the difference between the rotation angle estimation value θest and the first angle detection value θ1 and the difference between the first angle detection value θ1 and the second angle detection value θ2.

Third Embodiment

A configuration of a rotating machine control device including a failure determination device according to a third embodiment of the present invention is basically the same as that of FIG. 1, but the processing in the angle sensor failure determiner 15a differs.

Figure 6:
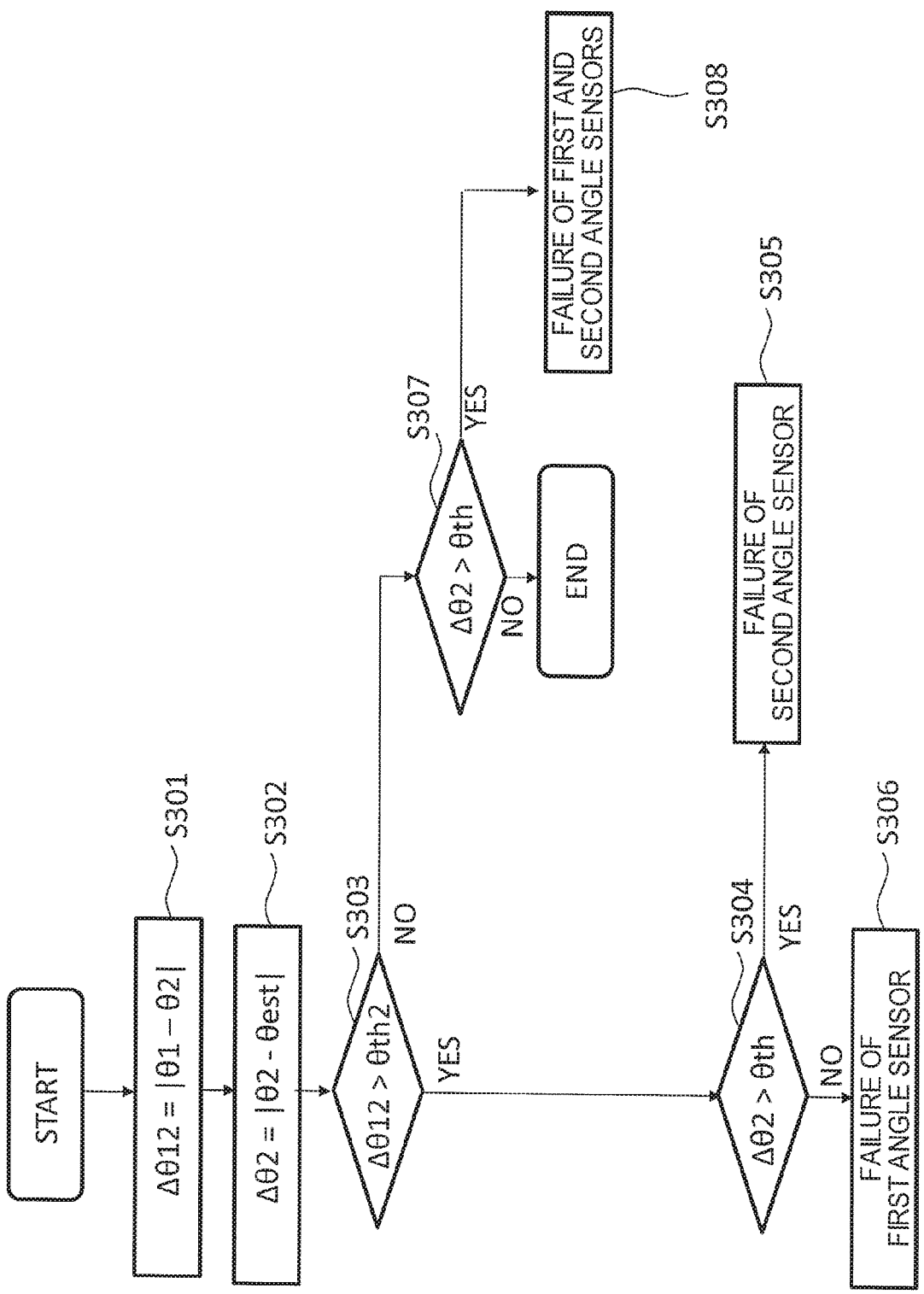
FIG. 6 is a flow chart for illustrating an example of an operation of an angle sensor failure determiner in the third embodiment of the present invention.

FIG. 6 is a flow chart for illustrating the calculation operation of the angle sensor failure determiner 15a in the third embodiment.

In Step S301, the absolute value of the difference between the first angle detection value θ1 and the second angle detection value θ2 is calculated, and the result is represented by Δθ12.

In Step S302, the absolute value of the difference between the second angle detection value θ2 and the rotation angle estimation value θest is calculated, and the result is represented by Δθ2.

In Step S303, Δθ12 is compared with a second angle deviation threshold value θth2. When Δθ12 is larger than the second angle deviation threshold value θth2, Step S304 is executed, and otherwise, Step S307 is executed.

In Step S304, Δθ2 is compared with the first angle deviation threshold value θth. When Δθ2 is larger than the first angle deviation threshold value θth, Step S305 is executed, and otherwise, Step S306 is executed.

In Step S305, it is determined that the second angle sensor 5 is out of order, and in Step S306, it is determined that the first angle sensor 4 is out of order.

In Step S307, Δθ2 is compared with the first angle deviation threshold value θth. When Δθ2 is larger than the first angle deviation threshold value θth, Step S308 is executed, and otherwise, the processing is ended.

In Step S308, it is determined that both of the first angle sensor 4 and the second angle sensor 5 are out of order.

As described above, according to the third embodiment, the failure of the first angle sensor and the second angle sensor can be detected based on the difference between the rotation angle estimation value and the second angle detection value and the difference between the first angle detection value and the second angle detection value.

The first angle deviation threshold value θth and the second angle deviation threshold value θth2 may be the same value.

As described above, according to the first to third embodiments, the failure of the first angle sensor and the second angle sensor can be determined based on at least two of the difference between the rotation angle estimation value θest and the first angle detection value θ1, the difference between the rotation angle estimation value θest and the second angle detection value θ2, and the difference between the first angle detection value θ1 and the second angle detection value θ2.

Fourth Embodiment

Figure 7:
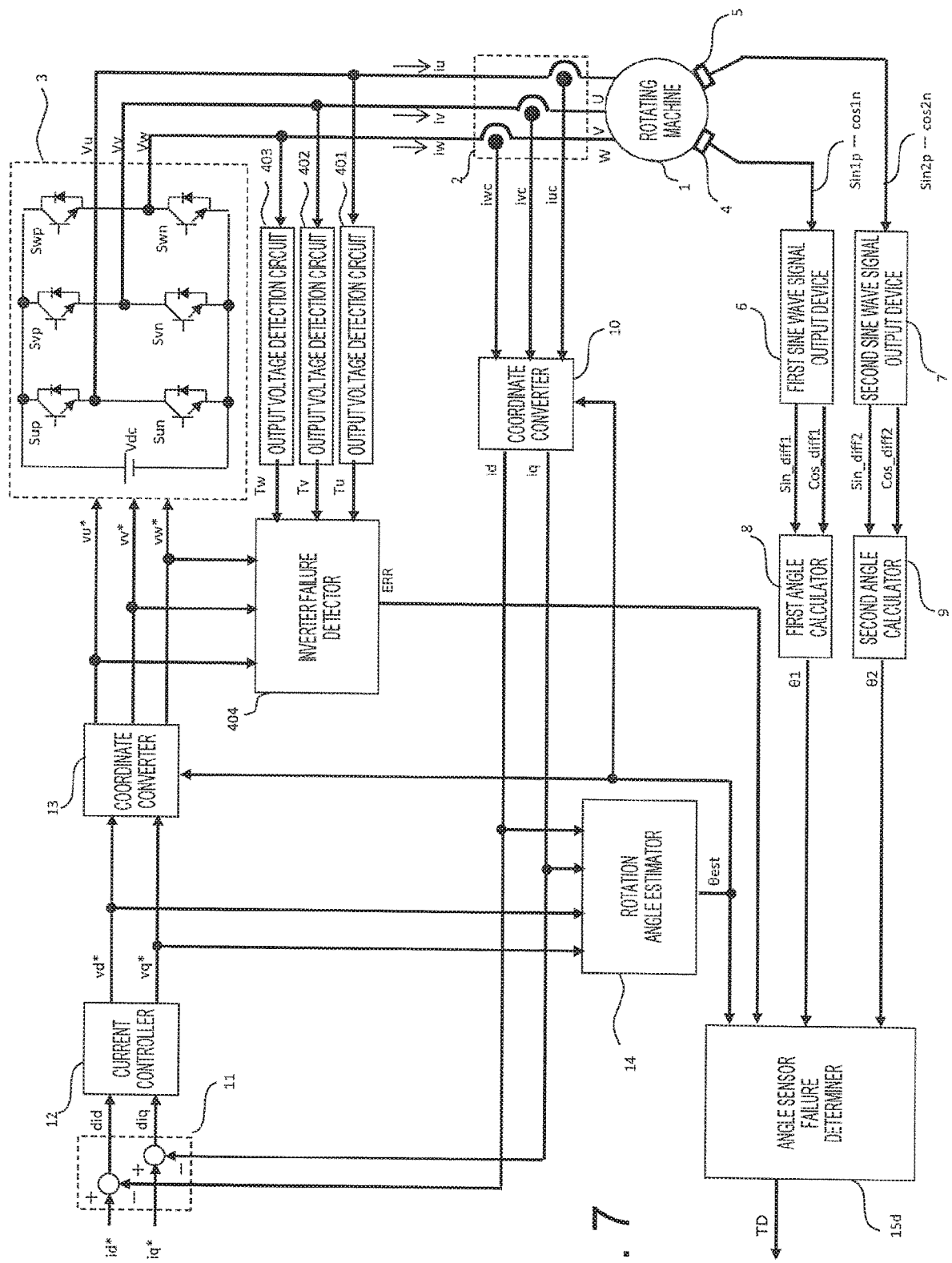
FIG. 7 is a diagram for illustrating an example of a configuration of a rotating machine control device including a failure determination device according to a fourth embodiment of the present invention.

FIG. 7 is a diagram for illustrating an example of a configuration of a rotating machine control device including a failure determination device according to a fourth embodiment of the present invention. The configuration differs from the configuration of the first to third embodiments illustrated in FIG. 1 in output voltage detection circuits 401, 402, and 403 for the respective phases, an inverter failure detector 404 or a power converter failure detector, and an angle sensor failure determiner 15d.

The output voltage detection circuit 401 is a circuit configured to receive input of Vu among the three-phase voltages (Vu, Vv, and Vw) output from the inverter 3 to output an ON time Tu of the voltage Vu, which corresponds to a time period in which the switching element Sup is turned on.

The output voltage detection circuit 402 is a circuit configured to receive input of Vv among the three-phase voltages (Vu, Vv, and Vw) output from the inverter 3 to output an ON time Tv of the voltage Vv, which corresponds to a time period in which the switching element Svp is turned on.

The output voltage detection circuit 403 is a circuit configured to receive input of Vw among the three-phase voltages (Vu, Vv, and Vw) output from the inverter 3 to output an ON time Tw of the voltage Vw, which corresponds to a time period in which the switching element Swp is turned on.

Figure 8:
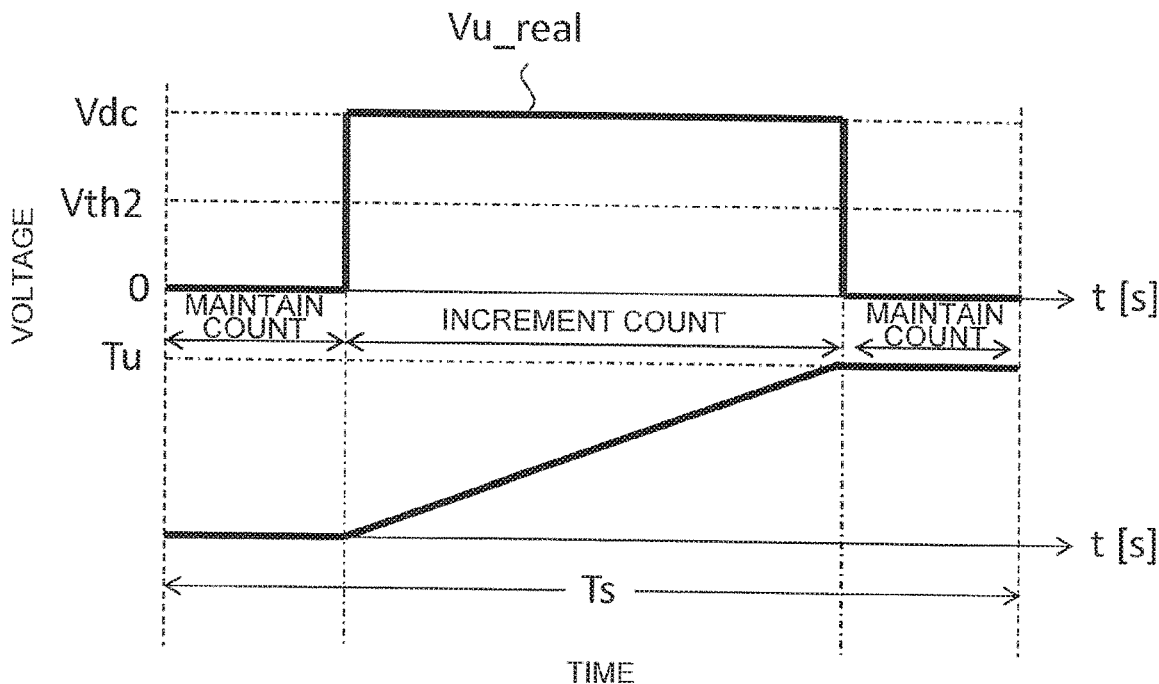
FIG. 8 is a graph for showing an operation of an output voltage detection circuit of FIG. 7.

Now, the operation of the output voltage detection circuit 401 is described with reference to FIG. 8. The operations of the output voltage detection circuits 402 and 403 are similar to that of the output voltage detection circuit 401, and hence description thereof is omitted. A waveform Vu_real in the upper part of FIG. 8 is a waveform of the voltage Vu. The voltage Vu is a PWM waveform having a switching period Ts. In an OFF period, the switching element Sun is turned on, and hence 0 V is output. In an ON period, the switching element Sup is turned on, and hence Vdc [V] is output. The output voltage detection circuit 401 has a threshold value Vth2 (0<Vth2<Vdc). When Vu is larger than Vth2, the count is incremented, and the count is maintained when Vu is smaller than Vth2. In FIG. 8, the ON time Tu is counted, and the result is output to the inverter failure detector 404.

Figure 9:
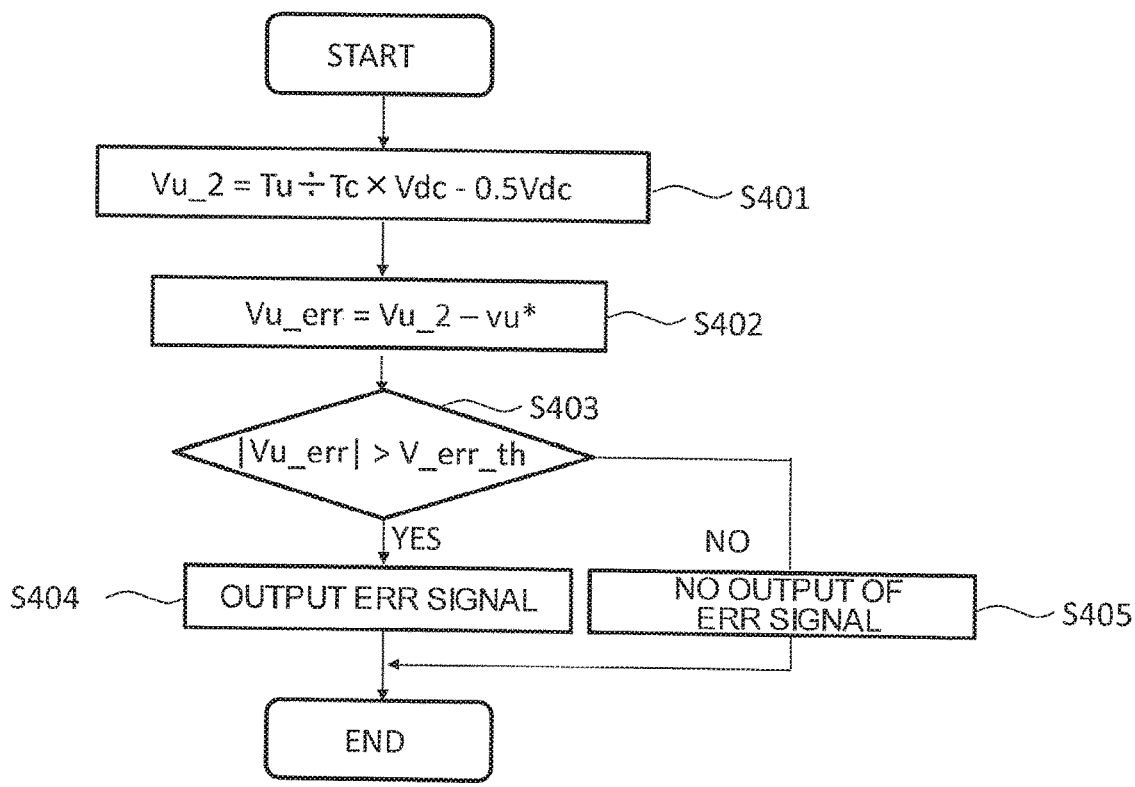
FIG. 9 is a flow chart for illustrating an example of an operation of an inverter failure detector of FIG. 7.

Next, the operation of the inverter failure detector 404 is described with reference to FIG. 9 being a flow chart for illustrating the calculation operation.

In Step S401, with use of the ON time Tu output from the output voltage detection circuit 401, the carrier period Tc, and the DC voltage Vdc, a U-phase output voltage Vu_2 is calculated as follows:

$$Vu\_2 = Tu/Tc \times Vdc - 0.5 Vdc.$$

In Step S402, the voltage command vu* is subtracted from Vu_2 obtained in Step S401 to calculate a U-phase voltage error Vu_err as follows:

$$Vu\_err = Vu\_2 - vu*$$

In Step S403, it is determined whether or not an absolute value |vu_err| of the U-phase voltage error vu_err obtained in Step S402 is larger than an error reference value v_err_th. In this case, considering the fact that the voltage command and the voltage that is actually output from the inverter 3 include errors due to a dead time and the like, the error reference value v_err_th is set to a value having a slight margin.

When "YES" is selected in Step S403, in Step S404, an ERR signal, which is a failure signal indicating that the failure is detected, is output to the angle sensor failure determiner 15d. On the other hand, when "NO" is selected, the ERR signal is not output in Step S405.

The description has been given above of the case of the U-phase, but also for the V-phase and the W-phase, an absolute value |Vv_err| of a V-phase voltage error and an absolute value |Vw_err| of a W-phase voltage error are calculated based on the ON time Tv of the V-phase and the ON time Tw of the W-phase, respectively. When the absolute values are larger than the error reference value V_err_th, a signal for stopping the inverter 3 is output.

When the angle sensor failure determiner 15d receives input of the ERR signal, the angle sensor failure determiner 15d cancels the angle sensor failure determination.

Next, the effect obtained by the fourth embodiment is described. When the inverter failure detector 404 detects the failure of the inverter 3, the voltage commands vu*, vv*, and vw* are values different from the voltages Vu, Vv, and Vw actually output from the inverter 3, and also the voltage commands vd* and vq* to be used for the calculation in the rotation angle estimator 14 have divergence from the voltages actually output from the inverter 3. In this case, the rotation angle estimation value θest obtained from the rotation angle estimator 14 becomes a value deviated from the true rotation angle θ of the rotating machine 1. When the angle sensor failure determiner 15d executes the angle sensor failure determination with use of θest, the failure of the angle sensors 4 and 5 may be erroneously detected. In view of this, when the inverter 3 is out of order, the inverter failure detector 404 outputs the ERR signal indicating the failure. While the ERR signal is output, the calculation of the angle sensor failure determiner 15d is canceled to prevent erroneous detection of the failure of the first angle sensor 4 and the second angle sensor 5.

The inverter failure detector 404 and calculation processing sections of the output voltage detection circuits 401, 402, and 403 for the respective phases can also be formed of a computer. Each of the output voltage detection circuits includes a voltage detector configured to detect a voltage and a calculation processor configured to perform calculation based on the detected voltage to output a signal indicating a detection result. This is true also in the following embodiments.

Fifth Embodiment

Figure 10:
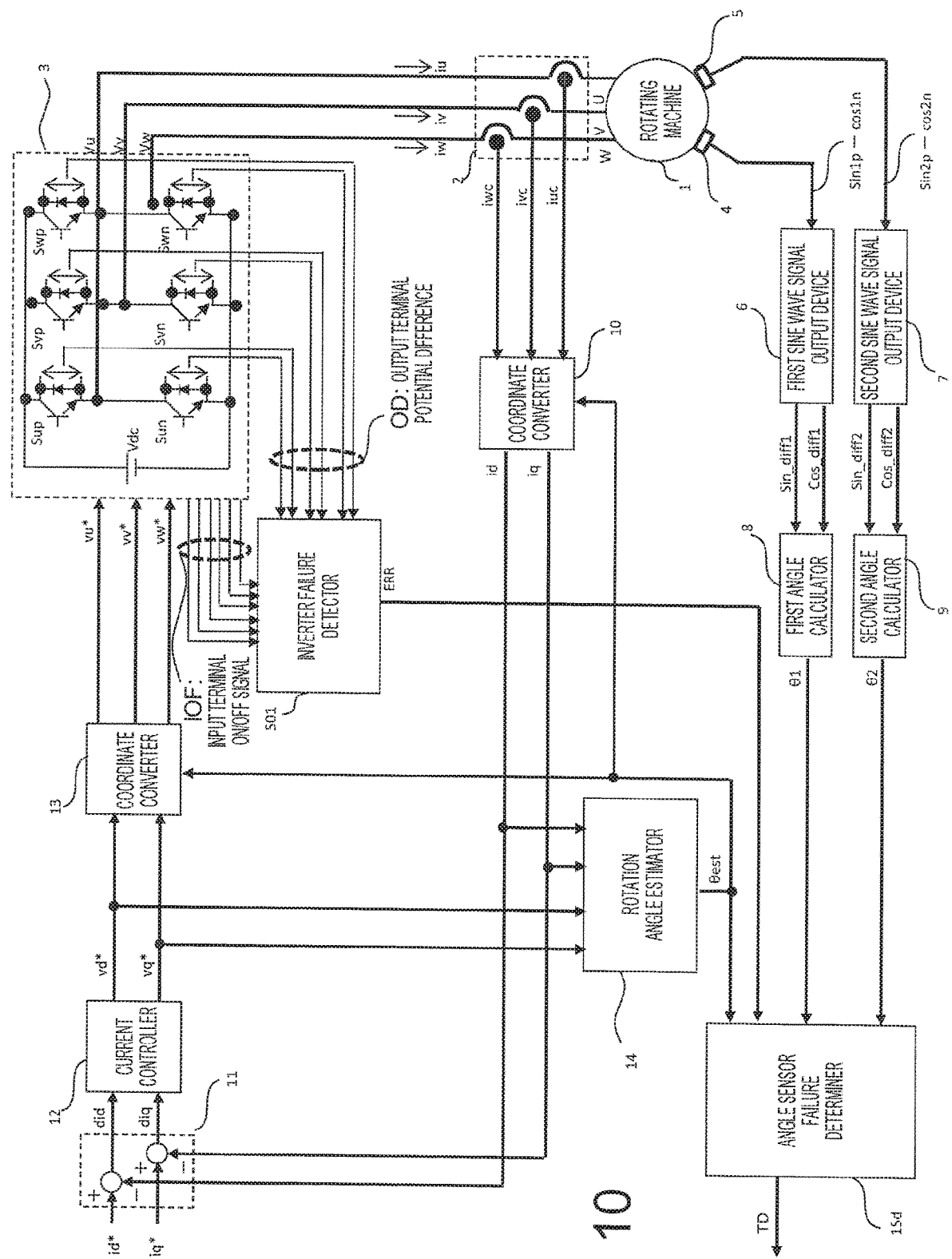
FIG. 10 is a diagram for illustrating an example of a configuration of a rotating machine control device including a failure determination device according to a fifth embodiment of the present invention.

FIG. 10 is a diagram for illustrating an example of a configuration of a rotating machine control device including a failure determination device according to a fifth embodiment of the present invention. The fifth embodiment differs from the above-mentioned embodiments in an inverter failure detector 501. The inverter failure detector 501 receives input of ON/OFF signals IOF to input terminals of respective switching elements of the inverter 3 and potential differences OD of output terminals to output the ERR signal indicating the failure to the angle sensor failure determiner 15d.

The ON/OFF signal IOF to the input terminal of each switching element of the inverter 3 is a gate-source voltage when the switching element is a MOSFET, a gate-emitter voltage when the switching element is an IGBT, and a base current when the switching element is a power transistor. The potential difference OD of the output terminal is a drain-source voltage when the switching element is a MOSFET, and a collector-emitter voltage when the switching element is an IGBT or a power transistor.

Figure 11:
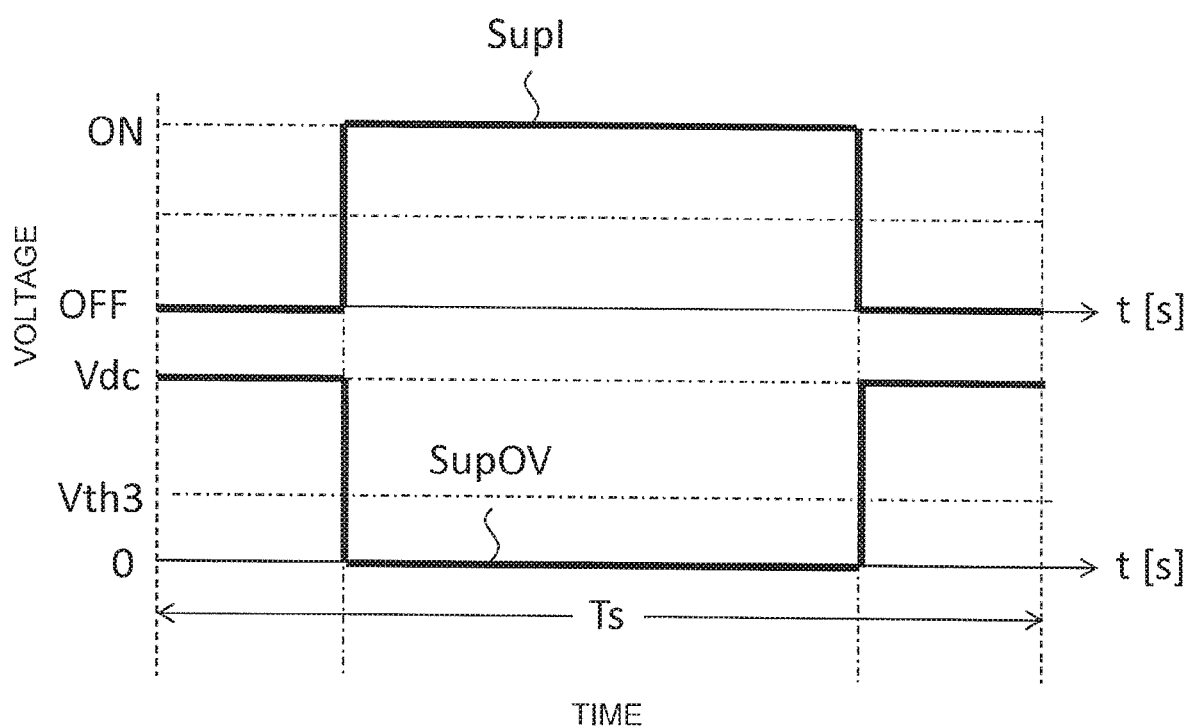
FIG. 11 is a graph for showing a relationship between an input terminal signal and an output terminal signal of a switching element of the inverter of FIG. 10.

Next, the relationship between the input terminal and the output terminal is described. FIG. 11 is a graph for showing a relationship between an input terminal signal SupI and an output terminal voltage SupOV of the switching element Sup as an example. When a signal for turning on the switching element is input to the switching element Sup, a signal for turning off the switching element is simultaneously input to the switching element Sun, and hence the output terminal voltage SupOV of the switching element Sup substantially matches 0. Meanwhile, when a signal for turning off the switching element is input to the switching element Sup, a signal for turning on the switching element is simultaneously output to the switching element Sun, and hence the output terminal voltage SupOV of the switching element Sup substantially matches Vdc.

In this case, when failure in which the switching element Sun turns on irrespective of the signal to the input terminal of the switching element Sun occurs due to the failure of the inverter 3, the switching element Sun turns on even when an input signal for turning off the switching element is input to the switching element Sun, and a signal for turning on the switching element is input to the input terminal of the switching element Sup. Thus, the voltage of the output terminal of the switching element Sup has an abnormal value that is not 0. With use of this fact, in the fifth embodiment, when the voltage of the output terminal, for example, SupOV, at the time when a signal for turning on the switching element, for example, SupI, is input to the input terminal of each switching element forming the inverter 3 exceeds a threshold value, it is determined that the inverter 3 is out of order, and the ERR signal is output.

As described above, also in the fifth embodiment, the failure of the inverter 3 is detected, and the calculation of the angle sensor failure determiner 15d is canceled. In this manner, erroneous detection of the failure of the first angle sensor 4 and the second angle sensor 5 can be prevented.

The inverter failure detector 501 can also be formed of a computer.

Sixth Embodiment

Figure 12:
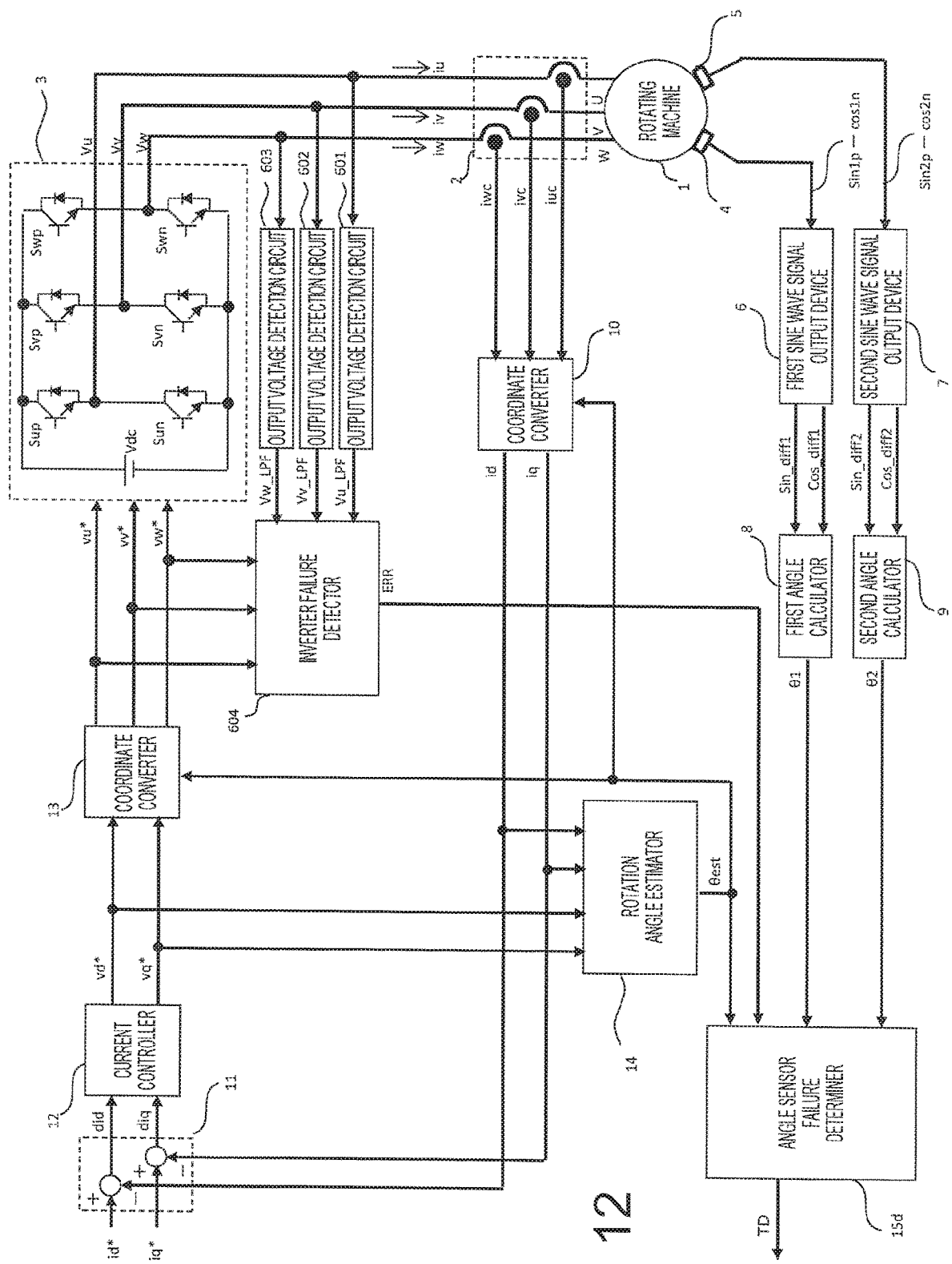
FIG. 12 is a diagram for illustrating an example of a configuration of a rotating machine control device including a failure determination device according to a sixth embodiment of the present invention.

FIG. 12 is a diagram for illustrating an example of a configuration of a rotating machine control device including a failure determination device according to a sixth embodiment of the present invention. The sixth embodiment differs from the above-mentioned embodiments in output voltage detection circuits 601, 602, and 603 and an inverter failure detector 604.

Figure 13:
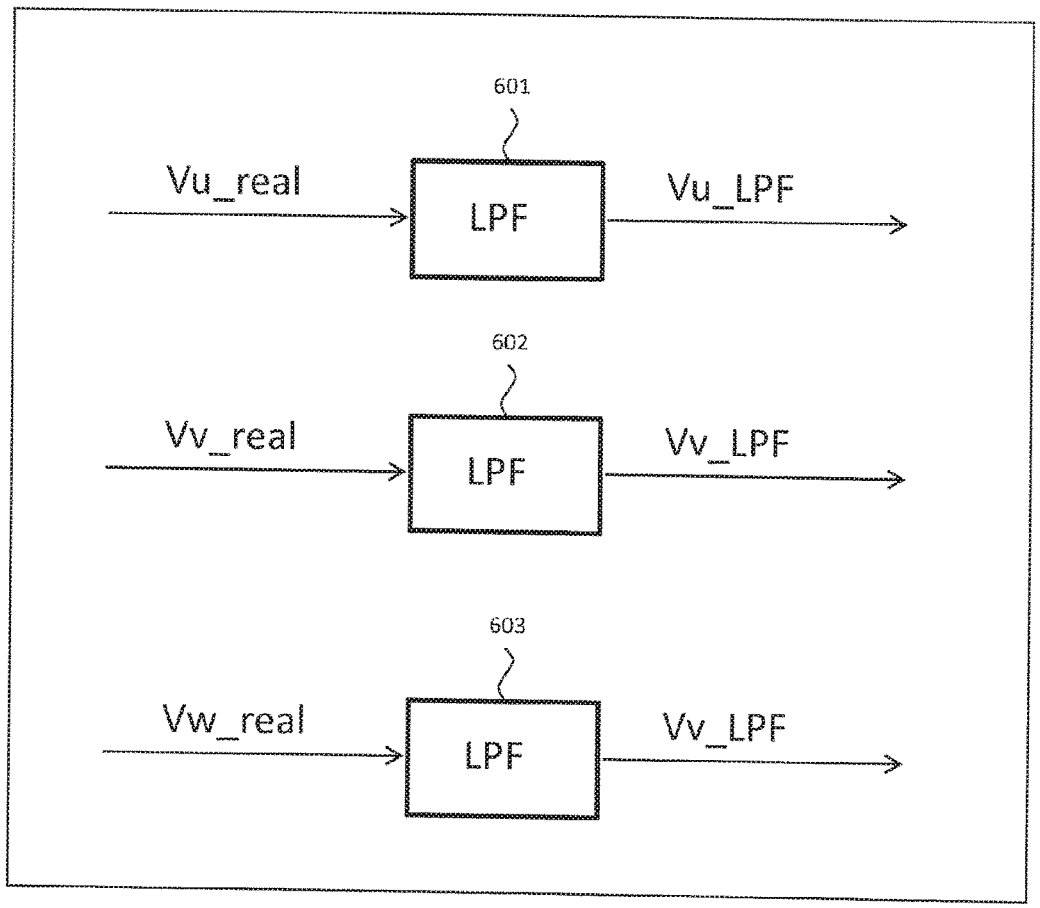
FIG. 13 is a diagram of an output voltage detection circuit of FIG. 12.

In the output voltage detection circuits 601, 602, and 603 of FIG. 13, the output voltage detection circuit 601 is a circuit configured to receive input of Vu among the three-phase voltages (Vu, Vv, and Vw) output from the inverter 3, which is represented by an actual voltage value Vu_real, to output a voltage Vu_LPF obtained by removing a carrier frequency component from Vu with use of a low-pass filter (LPF). The carrier frequency is a frequency of a carrier component, and is a reciprocal of the switching period Ts.

The output voltage detection circuit 602 is a circuit configured to receive input of Vv among the three-phase voltages (Vu, Vv, and Vw) output from the inverter 3, which is represented by an actual voltage value Vv_real, to output a voltage Vv_LPF obtained by removing a carrier frequency component from Vv with use of a low-pass filter (LPF).

The output voltage detection circuit 603 is a circuit configured to receive input of Vw among the three-phase voltages (Vu, Vv, and Vw) output from the inverter 3, which is represented by an actual voltage value Vw_real, to output a voltage Vw_LPF obtained by removing a carrier frequency component from Vw with use of a low-pass filter (LPF).

Figure 14:
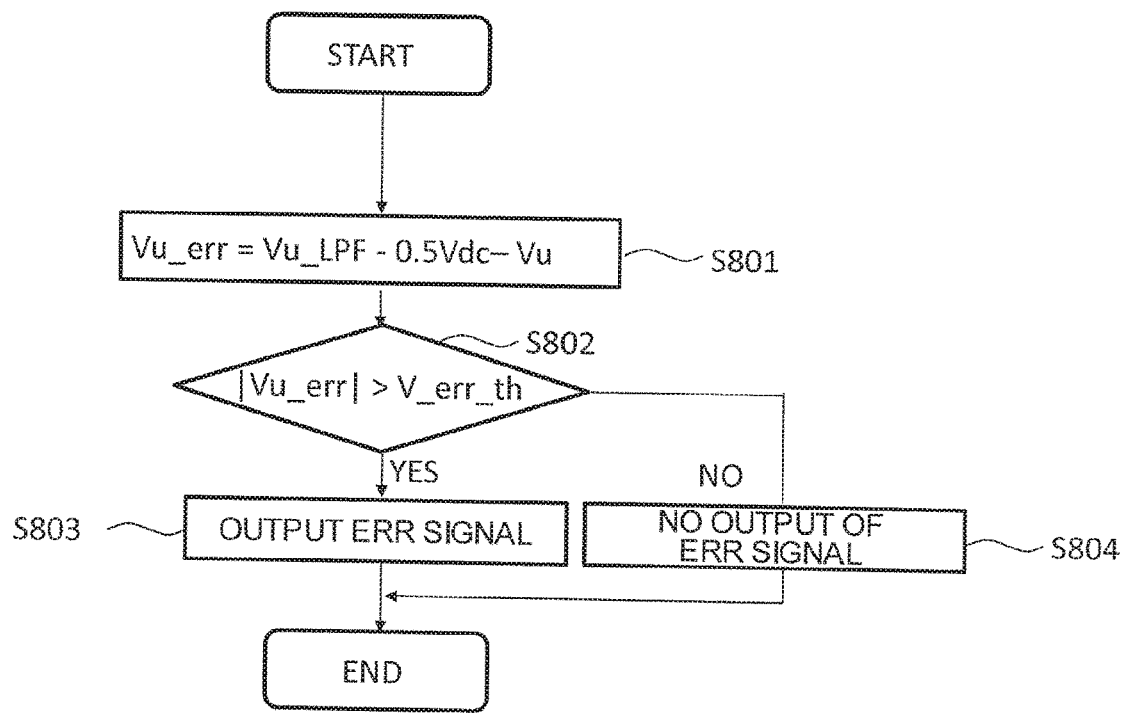
FIG. 14 is a flow chart for illustrating an example of an operation of an inverter failure detector of FIG. 12.

Next, the operation of the inverter failure detector 604 is described with reference to FIG. 14 being a flow chart for illustrating the calculation operation.

In Step S801, the three-phase voltage Vu and $0.5 \times Vdc$ are subtracted from Vu_LPF obtained by the output voltage detection circuit 601 formed of the LPF of FIG. 13 to calculate the U-phase voltage error Vu_err as follows:

$$Vu\_err = Vu\_LPF - 0.5 \times Vdc - Vu$$

In Step S802, it is determined whether or not the absolute value |Vu_err| of the U-phase voltage error Vu_err obtained in Step S801 is larger than the error reference value V_err_th.

When "YES" is selected in Step S802, in Step S803, the ERR signal indicating the failure is output, and the inverter 3 is stopped. On the other hand, when "NO" is selected, in Step S804, the ERR signal is not output.

The description has been given above of the case of the U-phase, but also for the V-phase and the W-phase, the absolute value |Vv_err| of the V-phase voltage error and the absolute value |Vw_err| of the W-phase voltage error are calculated based on Vv_LPF and Vw_LPF, respectively, and the absolute values are compared with the error reference value V_err_th. When the absolute values are larger than the error reference value, a signal for stopping the inverter 3 is output.

As described above, also in the sixth embodiment, the failure of the inverter 3 is detected, and the calculation of the angle sensor failure determiner 15d is canceled when the failure is detected. In this manner, erroneous detection of the failure of the first angle sensor 4 and the second angle sensor 5 can be prevented.

The inverter failure detector 604 and the calculation processors of the output voltage detection circuits 601, 602, and 603 can also be formed of a computer.

Seventh Embodiment

Figure 15:
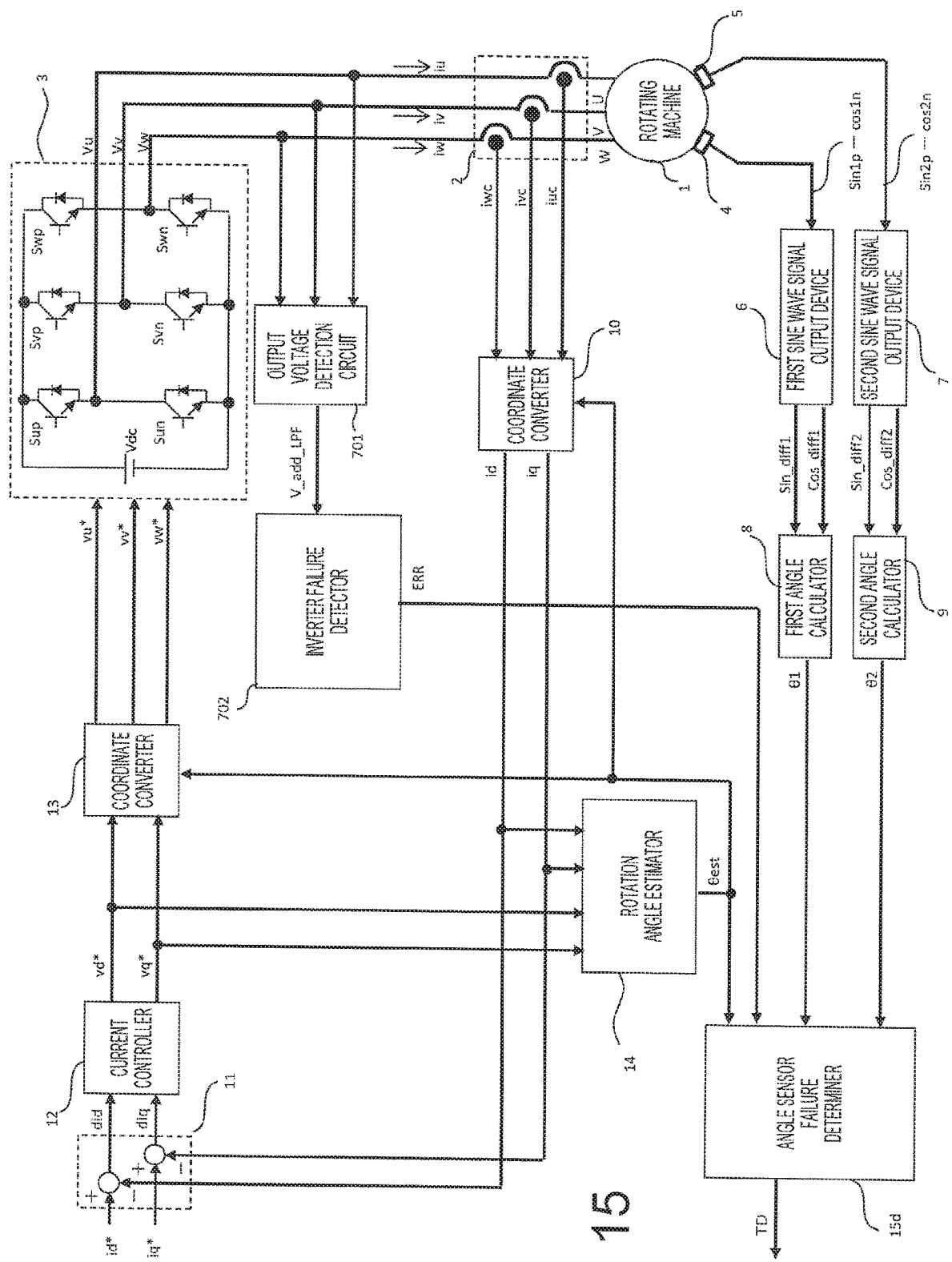
FIG. 15 is a diagram for illustrating an example of a configuration of a rotating machine control device including a failure determination device according to a seventh embodiment of the present invention.

FIG. 15 is a diagram for illustrating an example of a configuration of a rotating machine control device including a failure determination device according to a seventh embodiment of the present invention. The seventh embodiment differs from the above-mentioned embodiments in an output voltage detection circuit 701 and an inverter failure detector 702.

Figure 16:
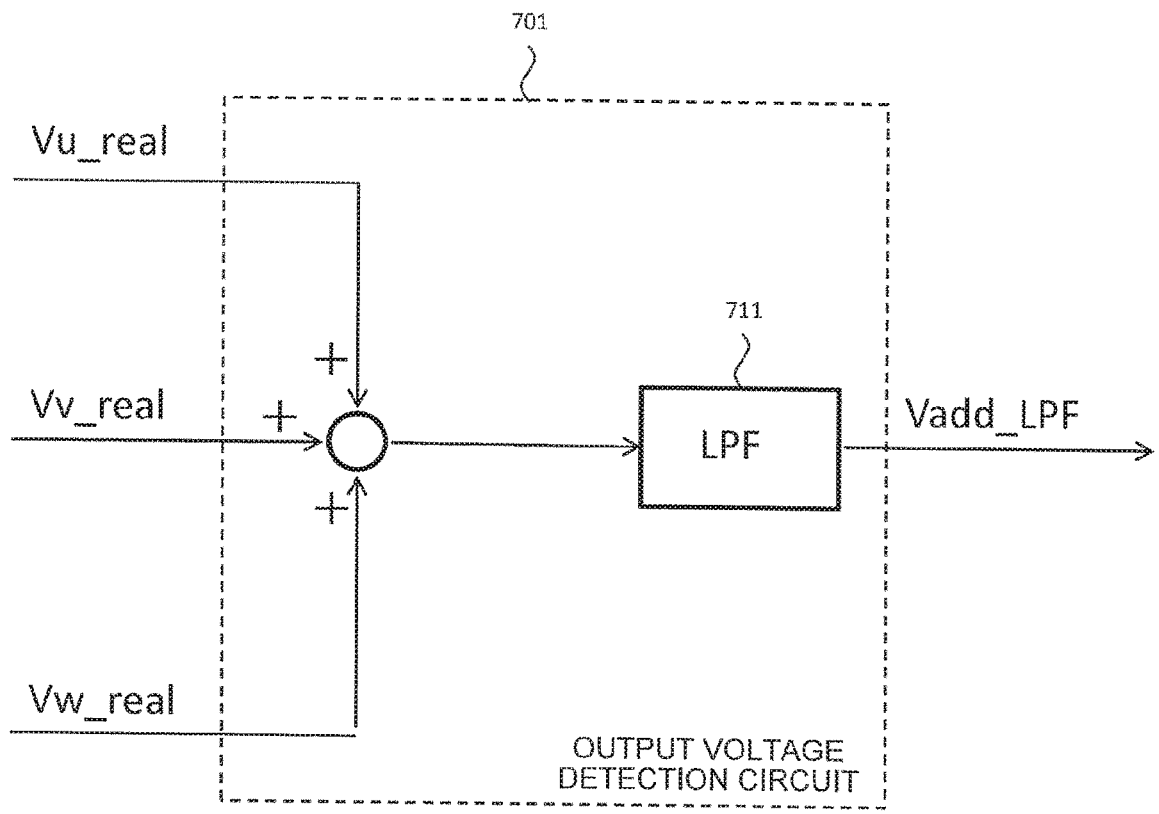
FIG. 16 is a diagram of an output voltage detection circuit of FIG. 15.

The output voltage detection circuit 701 illustrated in FIG. 16 is a circuit configured as follows. After the three-phase voltages (Vu, Vv, and Vw) represented by the actual voltage values Vu_real, Vv_real, and Vw_real output from the inverter 3 are detected, the output voltage detection circuit 701 outputs a voltage V_add_LPF obtained by adding voltages of all phases by an adder 710 and removing a carrier component or a carrier frequency component that is a reciprocal of the switching period Ts with use of a low-pass filter (LPF) 711.

Figure 17:
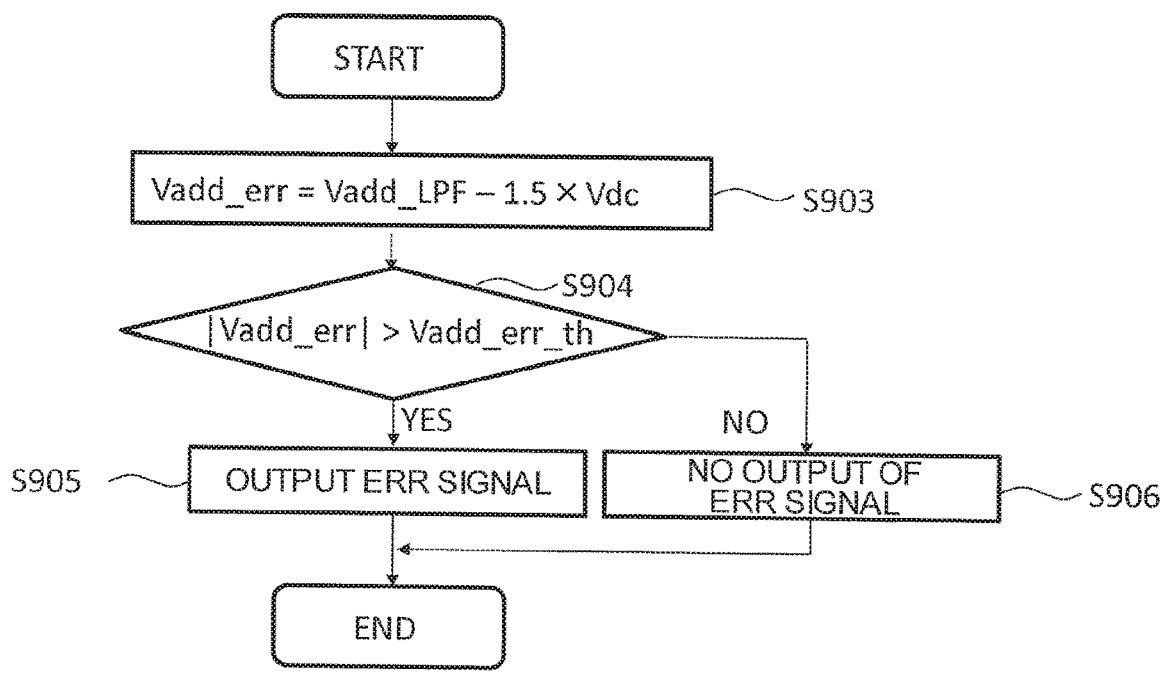
FIG. 17 is a flow chart for illustrating an example of an operation of an inverter failure detector of FIG. 15.

Next, the operation of the inverter failure detector 702 is described with reference to FIG. 17 being a flow chart for illustrating the calculation operation.

In Step S903, 1.5×Vdc is subtracted from Vadd_LPF to obtain an addition value error Vadd_err as follows:

$$Vadd\_err = Vadd\_LPF - 1.5 \times Vdc$$

In Step S904, it is determined whether or not the absolute value |Vadd_err| of the addition value error Vadd_err obtained in Step S903 is larger than an addition value error reference value Vadd_err_th.

When "YES" is selected in Step S904, in Step S905, the ERR signal indicating the failure is output, and the inverter 3 is stopped. On the other hand, when "NO" is selected, in Step S906, the ERR signal is not output.

As described above, also in the seventh embodiment, the failure of the inverter 3 is detected, and the calculation of the angle sensor failure determiner 15*d* is canceled when the failure is detected. In this manner, erroneous detection of the failure of the first angle sensor 4 and the second angle sensor 5 can be prevented.

The inverter failure detector 702 and the calculation processor of the output voltage detection circuit 701 can also be formed of a computer.

Eighth Embodiment

Figure 18:
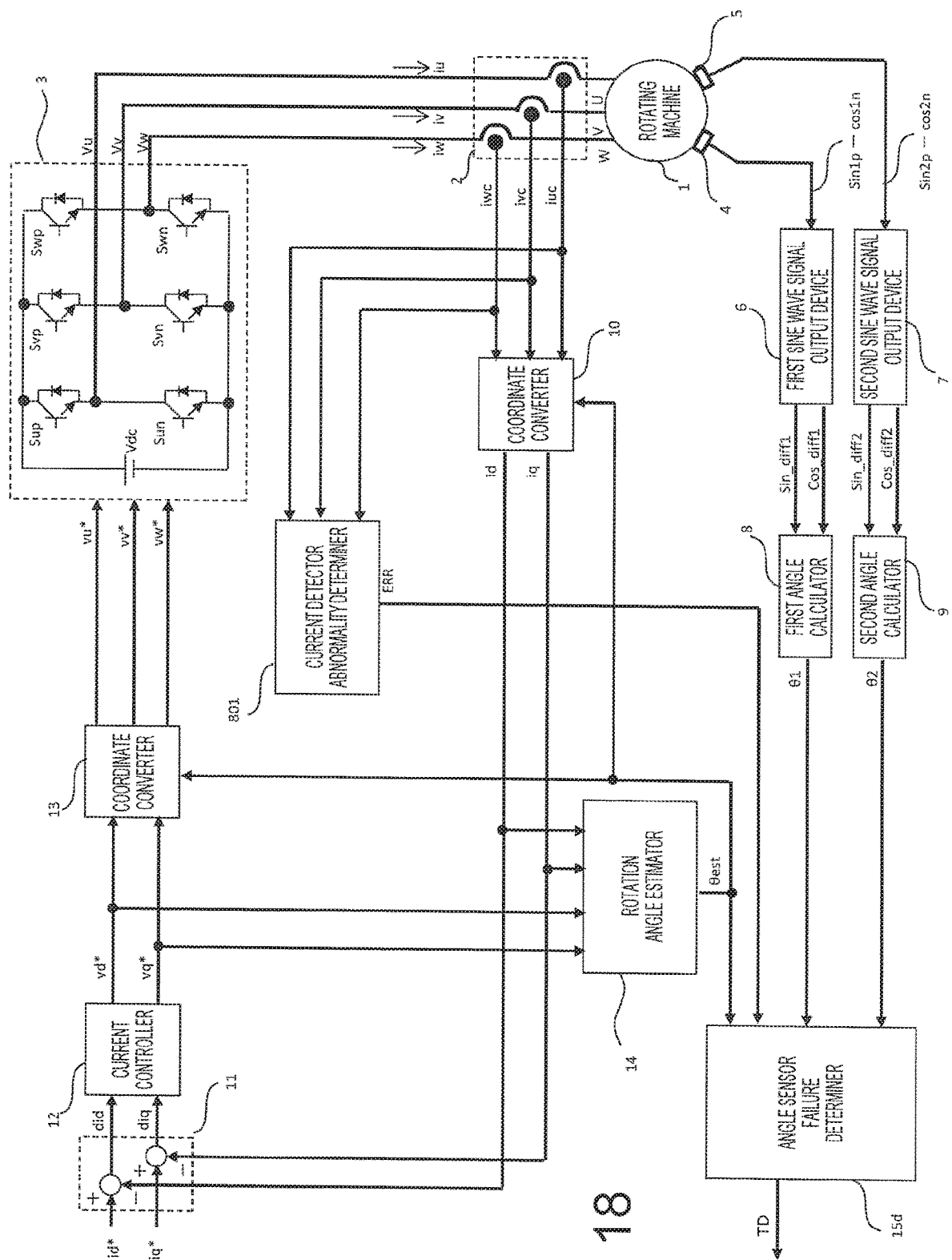
FIG. 18 is a diagram for illustrating an example of a configuration of a rotating machine control device including a failure determination device according to eighth and ninth embodiments of the present invention.

FIG. 18 is a diagram for illustrating an example of a configuration of a rotating machine control device including a failure determination device according to an eighth embodiment of the present invention. The eighth embodiment differs from the above-mentioned embodiments in a current detector abnormality determiner 801.

The current detector abnormality determiner 801 in the eighth embodiment utilizes the following fact. In the currents flowing through the rotating machine 1, the sum of the rotating machine phase currents iu, iv, and iw always matches 0, and hence when the current detector 2 is normal, also the sum of the rotating machine phase current detection values iuc, ivc, and iwc always matches 0. However, when an abnormality occurs, the sum has an abnormal value that is not 0.

Figure 19:
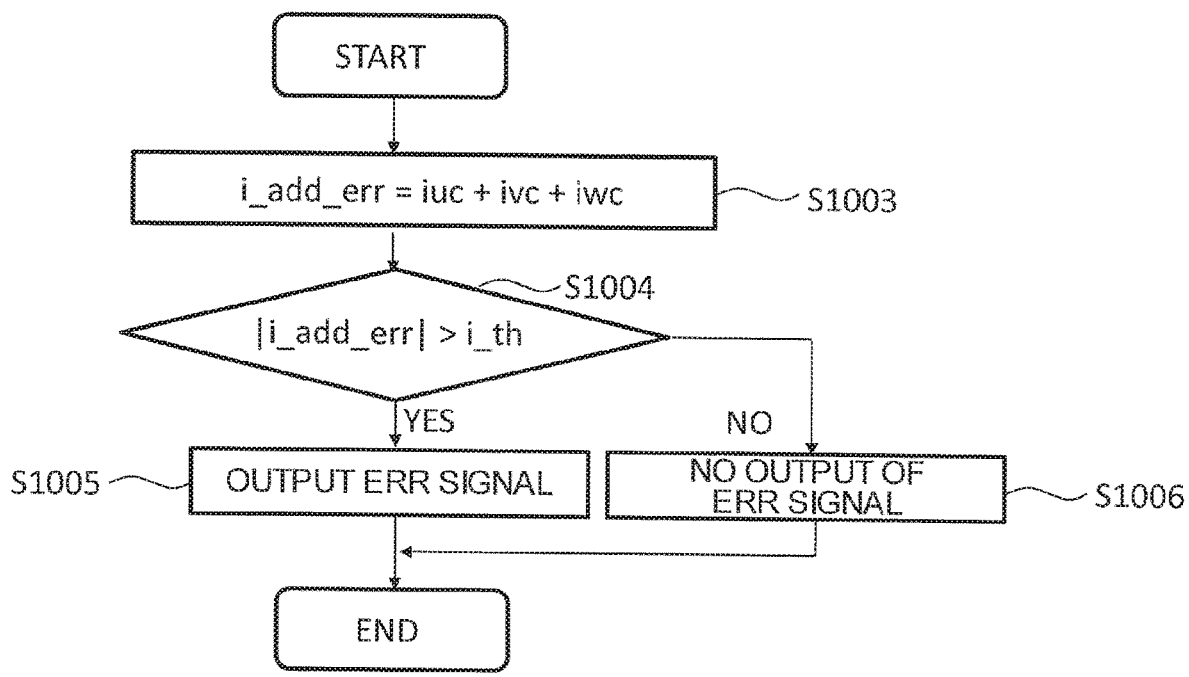
FIG. 19 is a flow chart for illustrating an example of an operation of a current detector abnormality determiner of FIG. 18 in the eighth embodiment of the present invention.

Next, the operation of the current detector abnormality determiner 801 is described with reference to FIG. 19 being a flow chart for illustrating the calculation operation.

In Step S1003, the rotating machine phase current detection values iuc, ivc, and iwc are added, and the result is represented by i_add_err.

In Step S1004, it is determined whether or not an absolute value |i_add_err| of i_add_err exceeds a current sum abnormality threshold value i_th. When the current sum abnormality threshold value i_th is exceeded (YES), Step S1005 is executed, and otherwise (NO), Step S1006 is executed. In Step S1005, the ERR signal indicating the failure is output. In Step S1006, the ERR signal is not output.

Next, the effect obtained by the eighth embodiment is described. When the current detector 2 is out of order, the rotating machine phase current detection values iuc, ivc, and iwc detected by the current detector 2 are values different from the rotating machine phase currents iu, iv, and iw that are actually supplied to the rotating machine 1. Therefore, the rotating machine currents id and iq to be used for calculation in the rotation angle estimator 14 also have values different from currents actually flowing through the rotating machine 1. In this case, the rotation angle estimation value θest obtained from the rotation angle estimator 14 becomes a value deviated from the true rotation angle θ of the rotating machine 1. When the angle sensor failure determiner 15*d* executes the angle sensor failure determination with use of θest, the failure of the angle sensors 4 and 5 may be erroneously detected.

In view of this, when the current detector 2 is out of order, the current detector abnormality determiner 801 outputs the ERR signal indicating the failure. While the ERR signal is output, the calculation of the angle sensor failure determiner 15*d* is canceled to prevent erroneous detection of the failure of the first angle sensor 4 and the second angle sensor 5.

The current detector abnormality determiner 801 can also be formed of a computer.

Ninth Embodiment

A configuration of a rotating machine control device including a failure determination device according to a ninth embodiment of the present invention is basically the same as that of FIG. 18, but the processing in the current detector abnormality determiner 801 differs.

Figure 20:
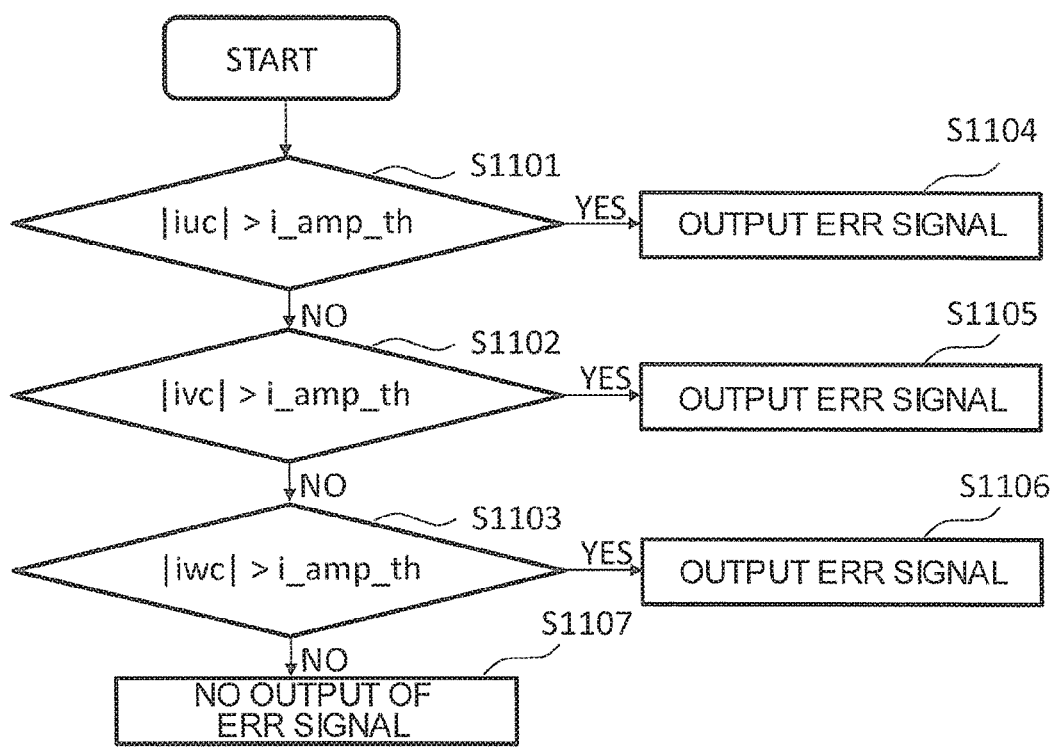
FIG. 20 is a flow chart for illustrating an example of an operation of a current detector abnormality determiner of FIG. 18 in the ninth embodiment of the present invention.

FIG. 20 is a flow chart for illustrating the calculation operation of the current detector abnormality determiner 801 in the ninth embodiment.

In Step S1101, it is determined whether or not an absolute value |iuc| of the rotating machine phase current detection value iuc exceeds a current amplitude abnormality threshold value i_amp_th. When the current amplitude abnormality threshold value i_amp_th is exceeded (YES), the ERR signal is output in Step S1104, and otherwise (NO), Step S1102 is executed. The current amplitude abnormality threshold value i_amp_th is set to a value having a slight margin with respect to an amplitude value of the rotating machine phase current.

In Step S1102, it is determined whether or not an absolute value |ivc| of the rotating machine phase current detection value ivc exceeds the current amplitude abnormality threshold value i_amp_th. When the current amplitude abnormality threshold value i_amp_th is exceeded (YES), the ERR signal indicating the failure is output in Step S1105, and otherwise (NO), Step S1103 is executed.

In Step S1103, it is determined whether or not an absolute value |iwc| of the rotating machine phase current detection value iwc exceeds the current amplitude abnormality threshold value i_amp_th. When the current amplitude abnormality threshold value i_amp_th is exceeded (YES), the ERR signal indicating the failure is output in Step S1106, and otherwise (NO), in Step S1107, the ERR signal is not output.

As described above, also in the ninth embodiment, the failure of the current detector 2 is detected, and the calculation of the angle sensor failure determiner 15*d* is canceled when the failure is detected. In this manner, erroneous detection of the failure of the first angle sensor 4 and the second angle sensor 5 can be prevented.

The current detector abnormality determiner 801 can also be formed of a computer.

Tenth Embodiment

Figure 21:
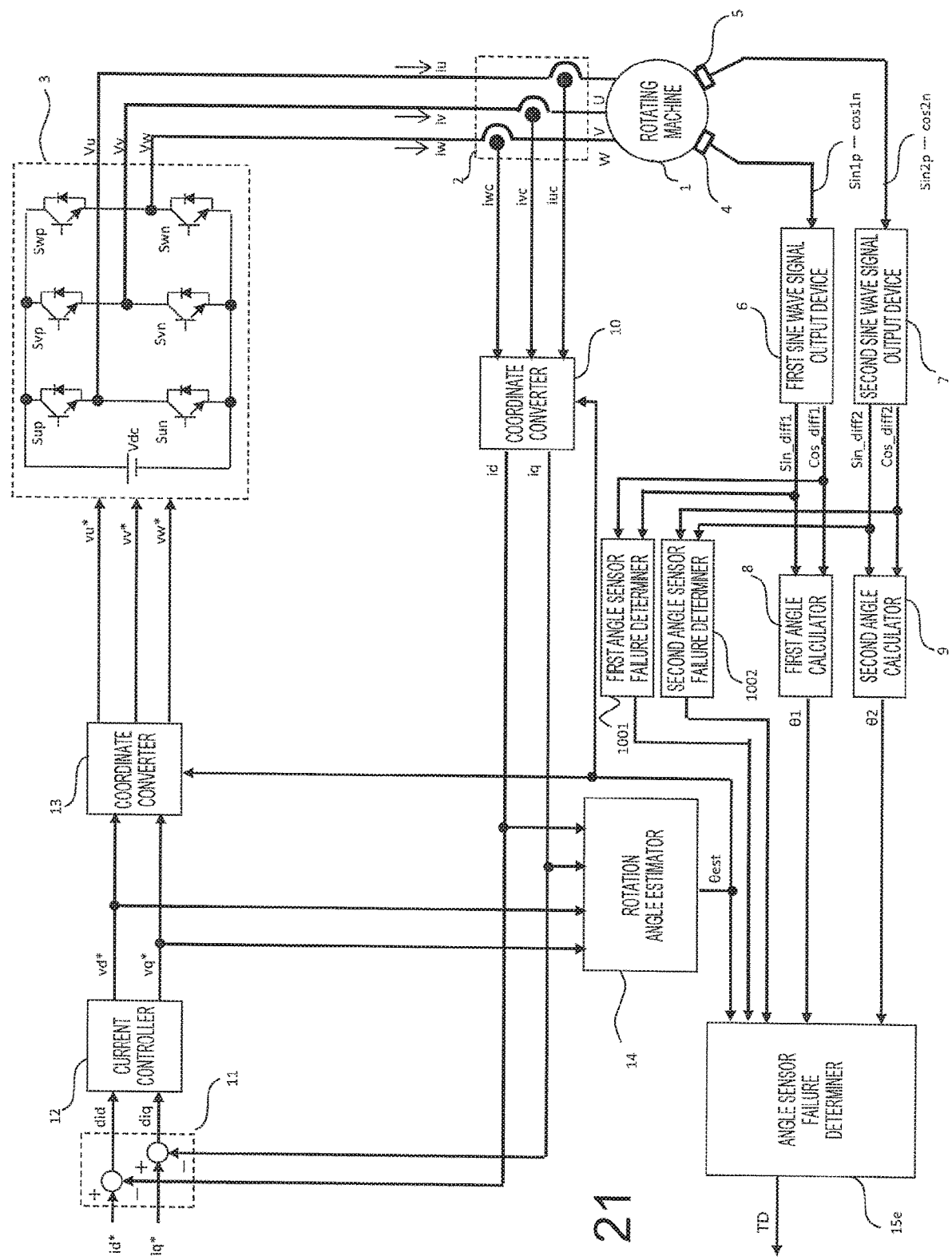
FIG. 21 is a diagram for illustrating an example of a configuration of a rotating machine control device including a failure determination device according to a tenth embodiment of the present invention.

FIG. 21 is a diagram for illustrating an example of a configuration of a rotating machine control device including a failure determination device according to a tenth embodiment of the present invention. The tenth embodiment differs from the above-mentioned embodiments in a first angle sensor failure determiner 1001, a second angle sensor failure determiner 1002, and an angle sensor failure determiner 15e.

Figure 22:
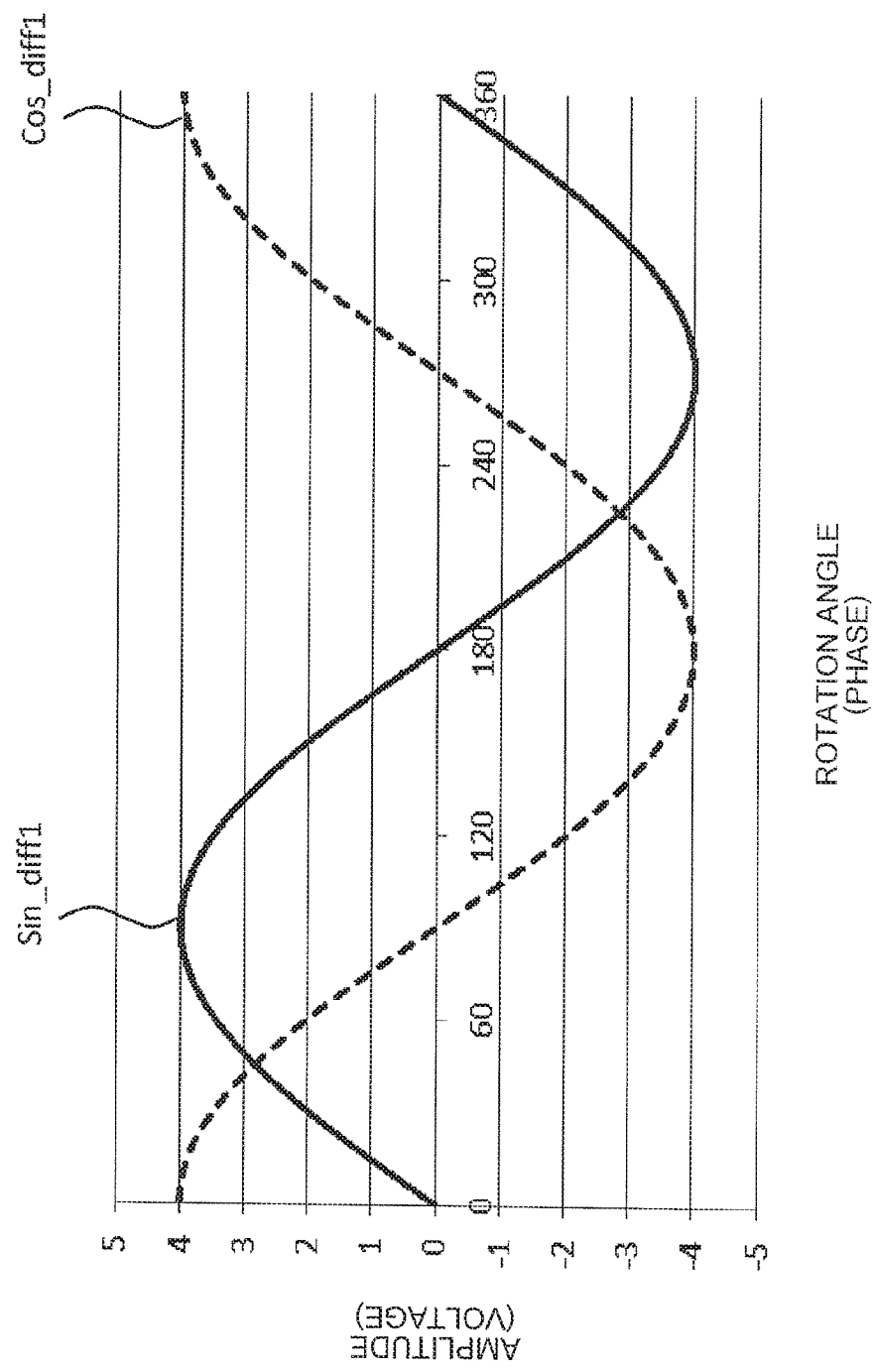
FIG. 22 is a graph for showing output signals of a first sine wave signal output device of FIG. 21.
Figure 23:
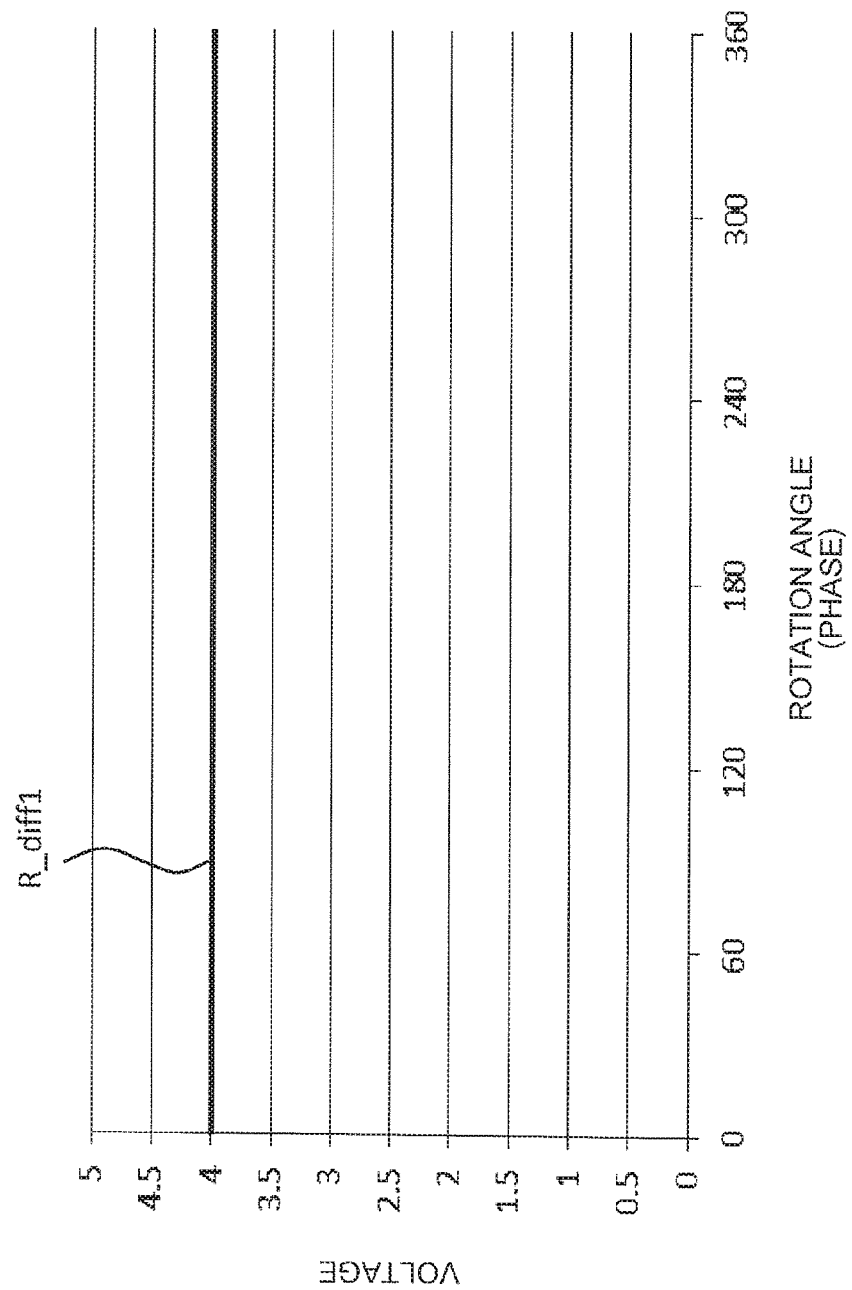
FIG. 23 is a graph for showing change at the time of a normal state of a value of a square root of a sum of squares obtained by a first angle sensor failure determiner of FIG. 21.

From the first angle sensor 4, the first sine wave signal Sin_diff1 and the second sine wave signal Cos_diff1 having phases shifted from each other by 90 degrees as shown in FIG. 22 can be obtained via the first sine wave signal output device 6. Therefore, a value R_diff1 of a square root of a sum of squares, which is obtained by squaring and then adding the respective signals and then obtaining the square root thereof, is a constant value as shown in FIG. 23. In contrast, when the value R_diff1 of the square root of the sum of the squares is deviated from a certain range, an abnormality is occurring in the first angle sensor 4.

Figure 24:
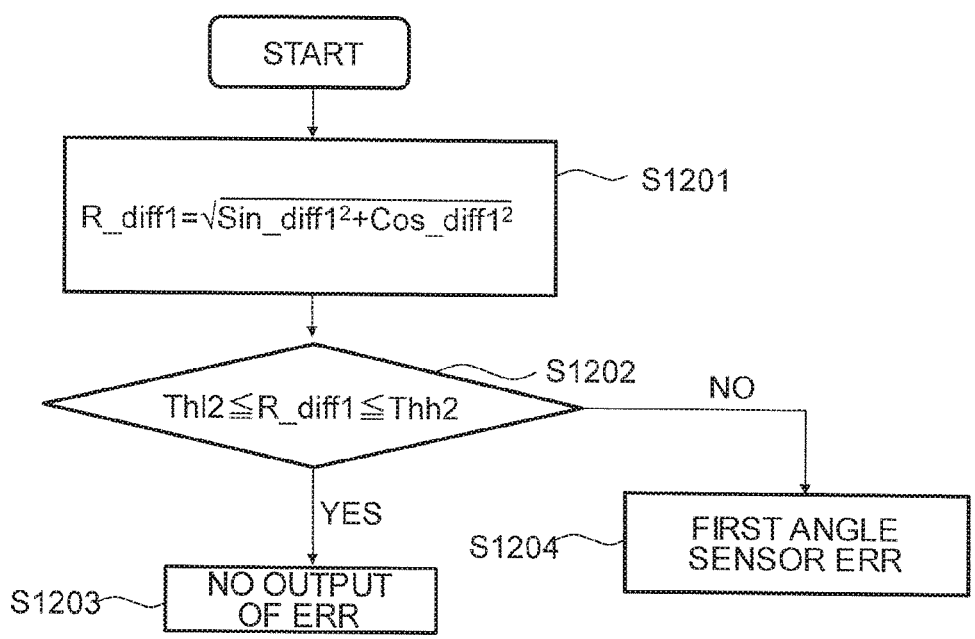
FIG. 24 is a flow chart for illustrating an example of an operation of the first angle sensor failure determiner of FIG. 21.

In view of this, the first angle sensor failure determiner 1001 in the tenth embodiment determines the failure based on the processing illustrated in a flow chart of FIG. 24.

In Step S1201, the above-mentioned value R_diff1 of the square root of the sum of the squares is calculated.

In Step S1202, it is determined whether or not R_diff1 is equal to or larger than a lower limit threshold value Thl2 and equal to or smaller than an upper limit threshold value Thh2. When "YES" is determined, in Step S1203, the ERR signal is not output. When "NO" is determined, in Step S1204, the ERR signal indicating the failure of the first angle sensor 4 is output to the angle sensor failure determiner 15e.

Figure 25:
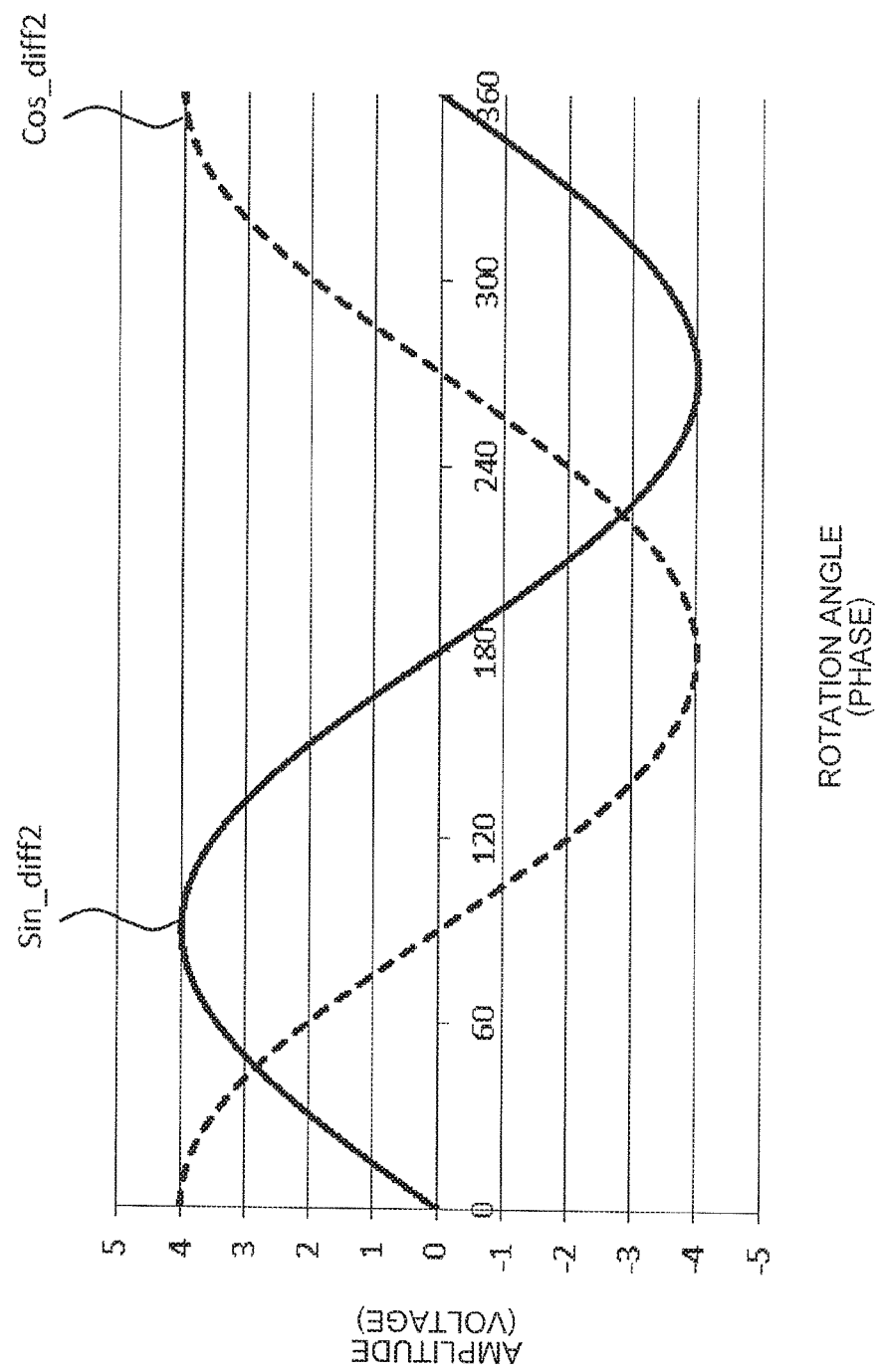
FIG. 25 is a graph for showing output signals of a second sine wave signal output device of FIG. 21.
Figure 26:
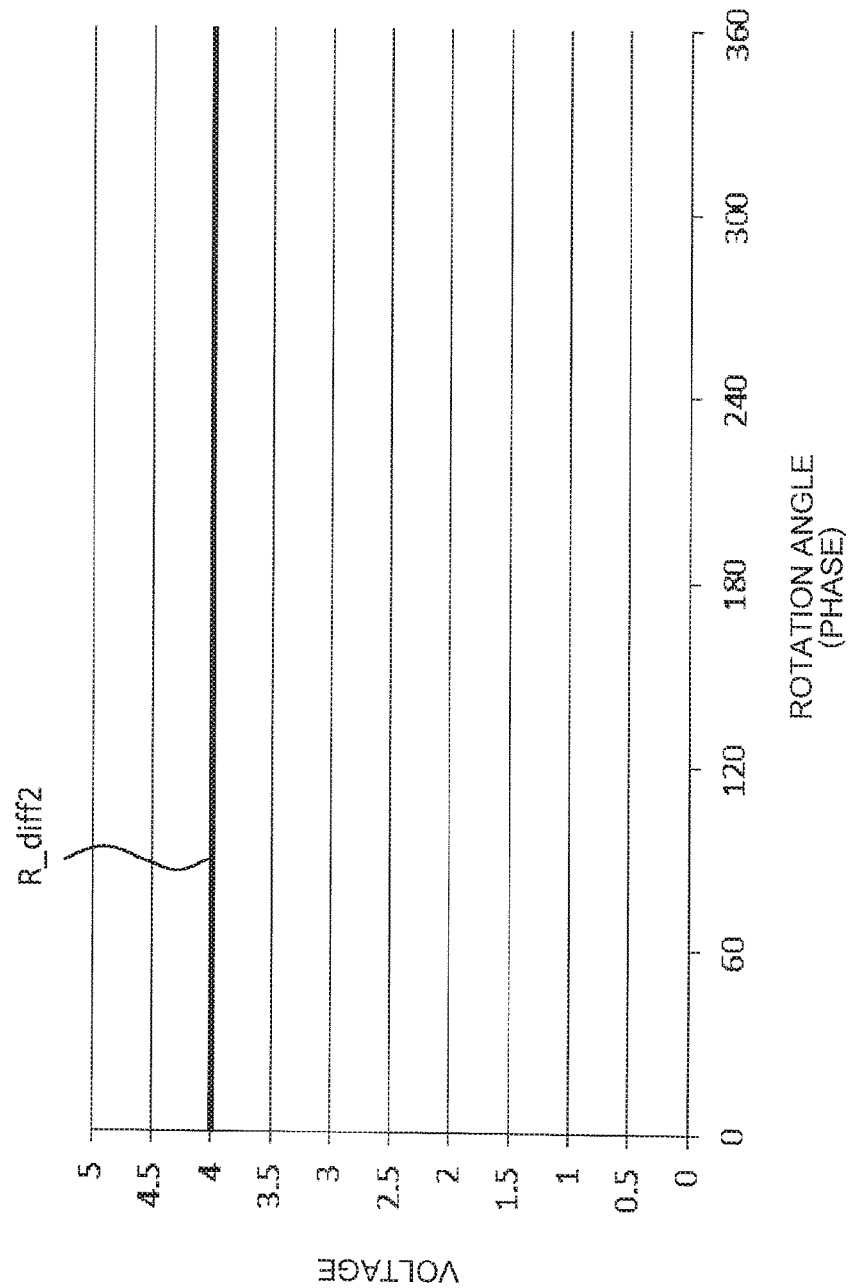
FIG. 26 is a graph for showing change at the time of a normal state of a value of a square root of a sum of squares obtained by a second angle sensor failure determiner of FIG. 21.

Meanwhile, from the second angle sensor 5, the third sine wave signal Sin_diff2 and the fourth sine wave signal Cos_diff2 having phases shifted from each other by 90 degrees as shown in FIG. 25 can be obtained via the second sine wave signal output device 7. Therefore, a value R_diff2 of a square root of a sum of squares, which is obtained by squaring and then adding the respective signals and then obtaining the square root thereof, is a constant value as shown in FIG. 26. In contrast, when the value R_diff2 of the square root of the sum of the squares is deviated from a certain range, an abnormality is occurring in the second angle sensor 5.

Figure 27:
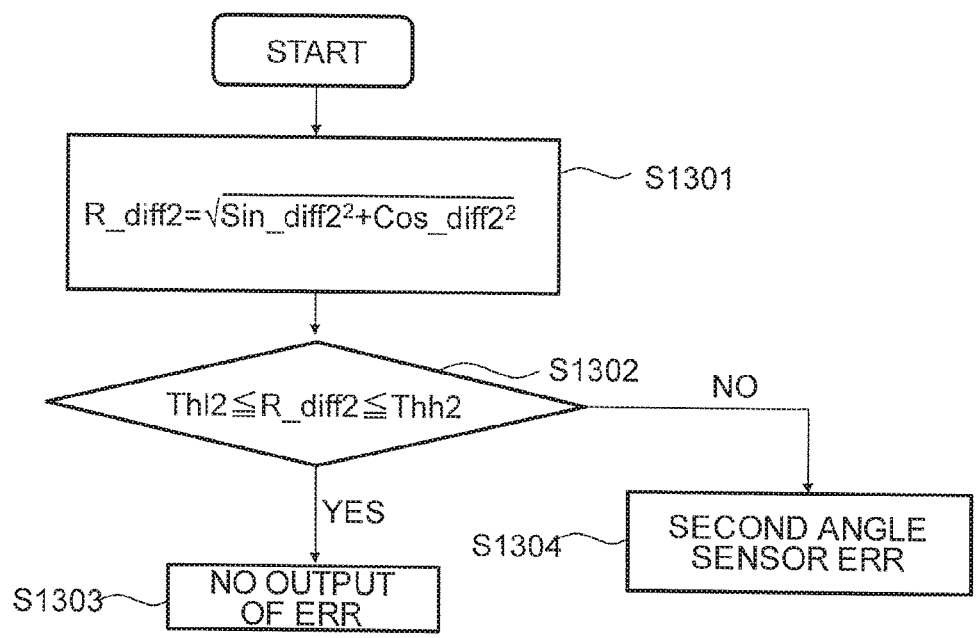
FIG. 27 is a flow chart for illustrating an example of an operation of the second angle sensor failure determiner of FIG. 21.

In view of this, the second angle sensor failure determiner 1002 in the tenth embodiment determines the failure based on the processing illustrated in a flow chart of FIG. 27.

In Step S1301, the above-mentioned value R_diff2 of the square root of the sum of the squares is calculated.

In Step S1302, it is determined whether or not R_diff2 is equal to or larger than the lower limit threshold value Thl2 and equal to or smaller than the upper limit threshold value Thh2. When "YES" is determined, in Step S1303, the ERR signal is not output. When "NO" is determined, in Step S1304, the ERR signal indicating the failure of the second angle sensor 5 is output to the angle sensor failure determiner 15e.

When the angle sensor failure determiner 15e detects the ERR signal indicating the failure of the first angle sensor 4 or the second angle sensor 5, the angle sensor failure determiner 15e determines that the detected angle sensor is out of order.

Subsequently, the effect obtained by the tenth embodiment is described. The rotation angle estimator 14 calculates the rotation angle estimation value θest with use of the impedance constants (R, Ld, and Lq) of the rotating machine 1, but the value stored in the memory 103 for the rotation angle estimator 14 does not always match the true value in the rotating machine 1. For example, when the rotating machine current is continuously supplied to the rotating machine 1 for a long period of time, the winding resistance R may be increased, and the inductances Ld and Lq may be reduced due to magnetic saturation. Therefore, when the rotating machine current is supplied, the rotation angle estimation value θest does not always match the true rotation angle θ of the rotating machine 1.

In view of this, the values of Sin_diff1 and Cos_diff1 based on the output of the first angle sensor 4 are input to the first angle sensor failure determiner 1001 so that the failure of the first angle sensor 4 is detected. In this manner, the failure of the first angle sensor 4 can be detected with higher accuracy.

Similarly, also for the second angle sensor 5, the values of Sin_diff2 and Cos_diff2 based on the output of the second angle sensor 5 are input to the second angle sensor failure determiner 1002 so that the failure of the second angle sensor 5 is detected. In this manner, the failure of the second angle sensor 5 can be detected with higher accuracy.

The lower limit threshold value Thl2 and the upper limit threshold value Thh2 are values obtained by vertically offsetting the value R_diff1 of the square root of the sum of the squares and the value R_diff2 of the square root of the sum of the squares at the time of a normal state by setting values.

The first angle sensor failure determiner 1001 and the second angle sensor failure determiner 1002 can also be formed of a computer.

Further, each of the first angle sensor failure determiner 1001 and the second angle sensor failure determiner 1002 obtains the value of the square root of the sum of the squares by squaring and then adding the first sine wave signal and the second sine wave signal and obtaining the square root thereof, but a sum of squares may be obtained instead of the value of the square root of the sum of the squares.

Further, the function of the first angle sensor failure determiner 1001 may be provided in the first sine wave signal output device 6. Further, the function of the second angle sensor failure determiner 1002 may be provided in the second sine wave signal output device 7.

Eleventh Embodiment

Figure 28:
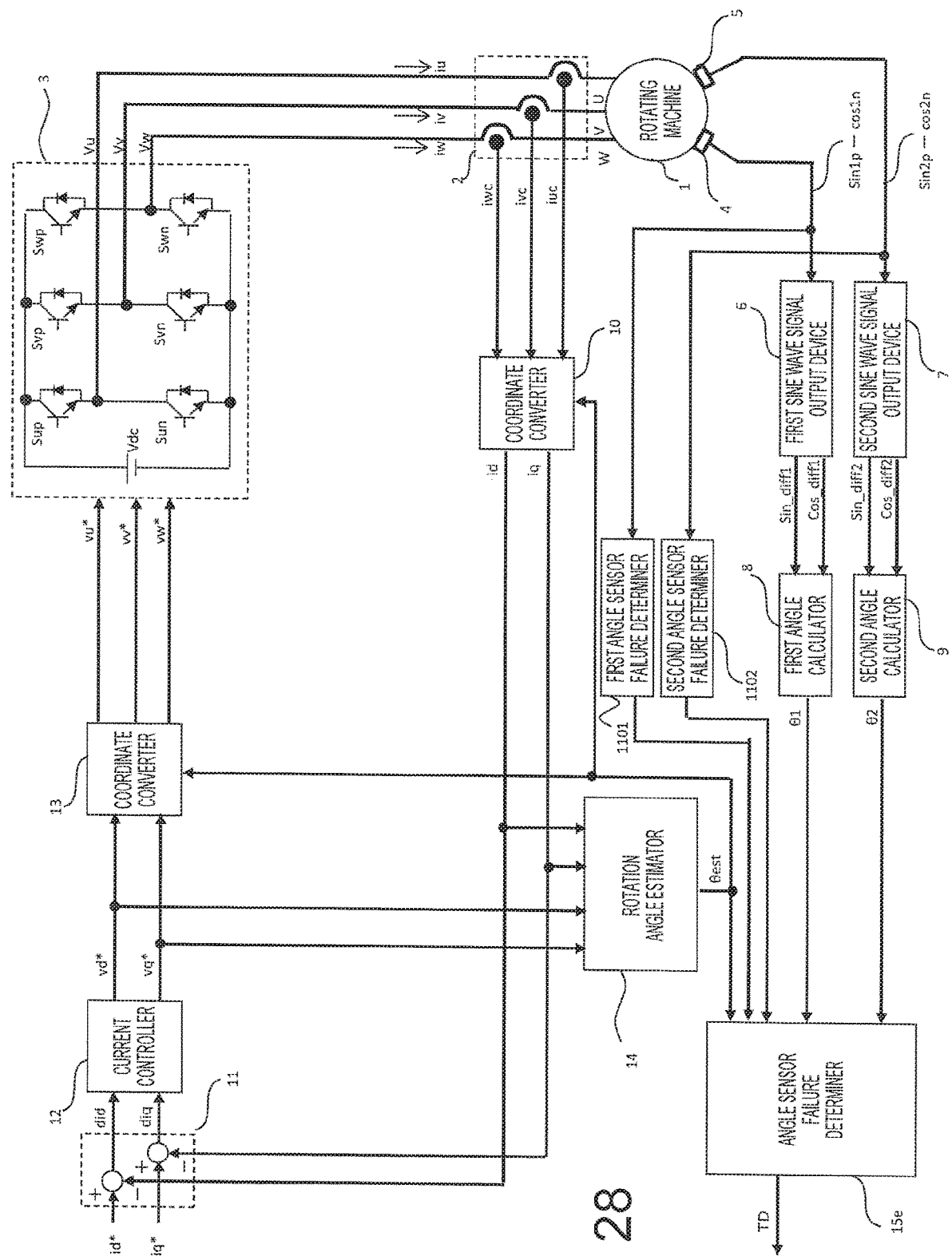
FIG. 28 is a diagram for illustrating an example of a configuration of a rotating machine control device including a failure determination device according to an eleventh embodiment of the present invention.

FIG. 28 is a diagram for illustrating an example of a configuration of a rotating machine control device including a failure determination device according to an eleventh embodiment of the present invention. The eleventh embodiment differs from the above-mentioned embodiments in a first angle sensor failure determiner 1101 and a second angle sensor failure determiner 1102.

Figure 29A:
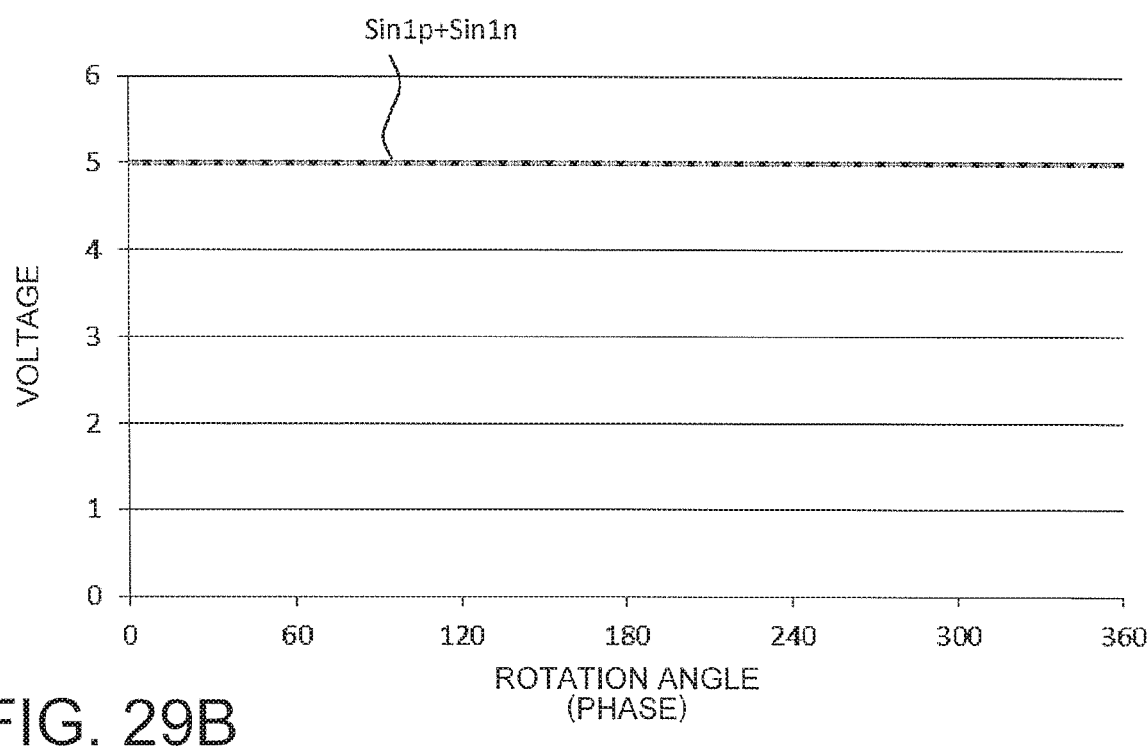
FIG. 29A and FIG. 29B are graphs for showing ideal states of Sin_sum1 and Cos_sum1 of a first angle sensor failure determiner of FIG. 28.

Now, the first angle sensor failure determiner 1101 is described. The sine signal 1 (Sin1p) and the sine signal 2 (Sin1n), which are the output of the first angle sensor 4 and shown in FIG. 2, have a phase difference of 180°, and hence a sum value (Sin_sum1) of the two signals is ideally twice a midpoint voltage as shown in FIG. 29A.

Figure 29B:
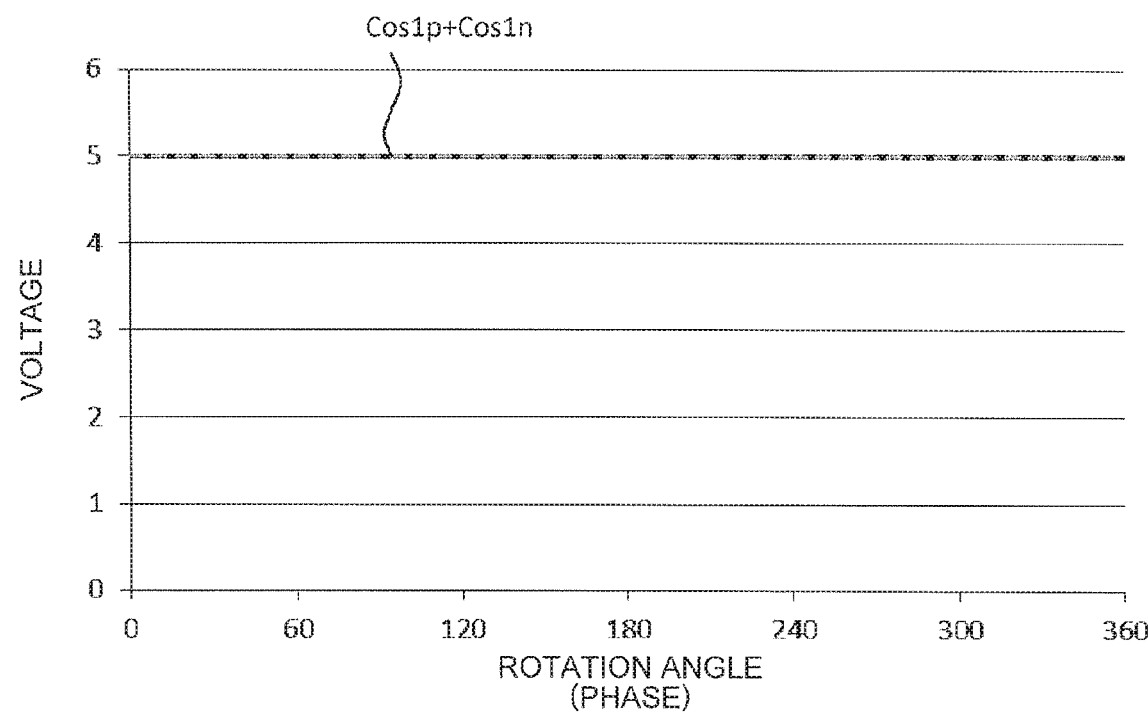

Similarly, the cosine signal 1 (Cos1p) and the cosine signal 2 (Cos1n) have a phase difference of 180°, and hence a sum value (Cos_sum1) of the two signals is ideally twice a midpoint voltage as shown in FIG. 29B.

When any one of the four signals is deviated from the true value due to failure, the sum value Sin_sum1 or the sum value Cos_sum1 is deviated from twice the midpoint voltage. The first angle sensor failure determiner 1101 determines the failure based on the deviation amount. The sum value is slightly fluctuated from twice the midpoint voltage due to circuit variations, temperature change, secular change, and the like, and hence a width is required to be provided as threshold values for the failure determination.

Figure 30:
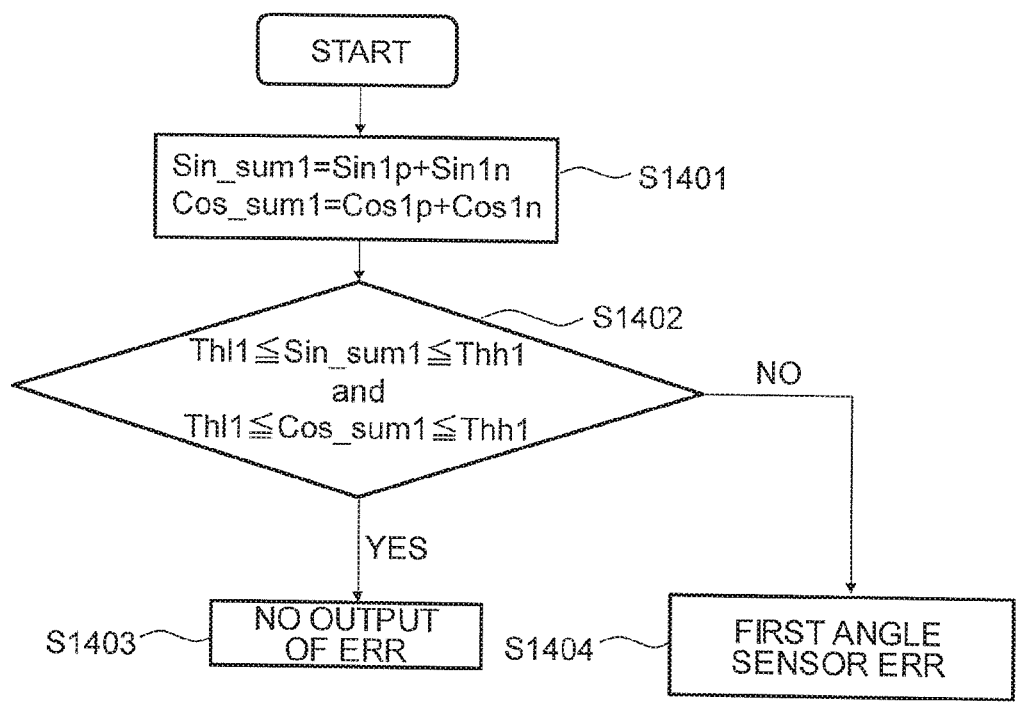
FIG. 30 is a flow chart for illustrating an example of an operation of the first angle sensor failure determiner of FIG. 28.

The first angle sensor failure determiner 1101 determines the failure in accordance with the processing illustrated in a flow chart of FIG. 30.

In Step S1401, the sum value Sin_sum1 is calculated from the sum of the sine signal 1 (Sin1p) and the sine signal 2 (Sin1n), and the sum value Cos_sum1 is calculated from the sum of the cosine signal 1 (Cos1p) and the cosine signal 2 (Cos1n).

In Step S1402, it is determined whether or not the sum value Sin_sum1 is equal to or larger than a lower limit threshold value Thl1 and equal to smaller than an upper limit threshold value Thh1, and further the sum value Cos_sum1 is equal to or larger than the lower limit threshold value Thl1 and equal to or smaller than the upper limit threshold value Thh1. When "YES" is determined, in Step S1403, the ERR signal is not output. When "NO" is determined, in Step S1404 the ERR signal indicating the failure of the first angle sensor 4 is output to the angle sensor failure determiner 15e.

Figure 31A:
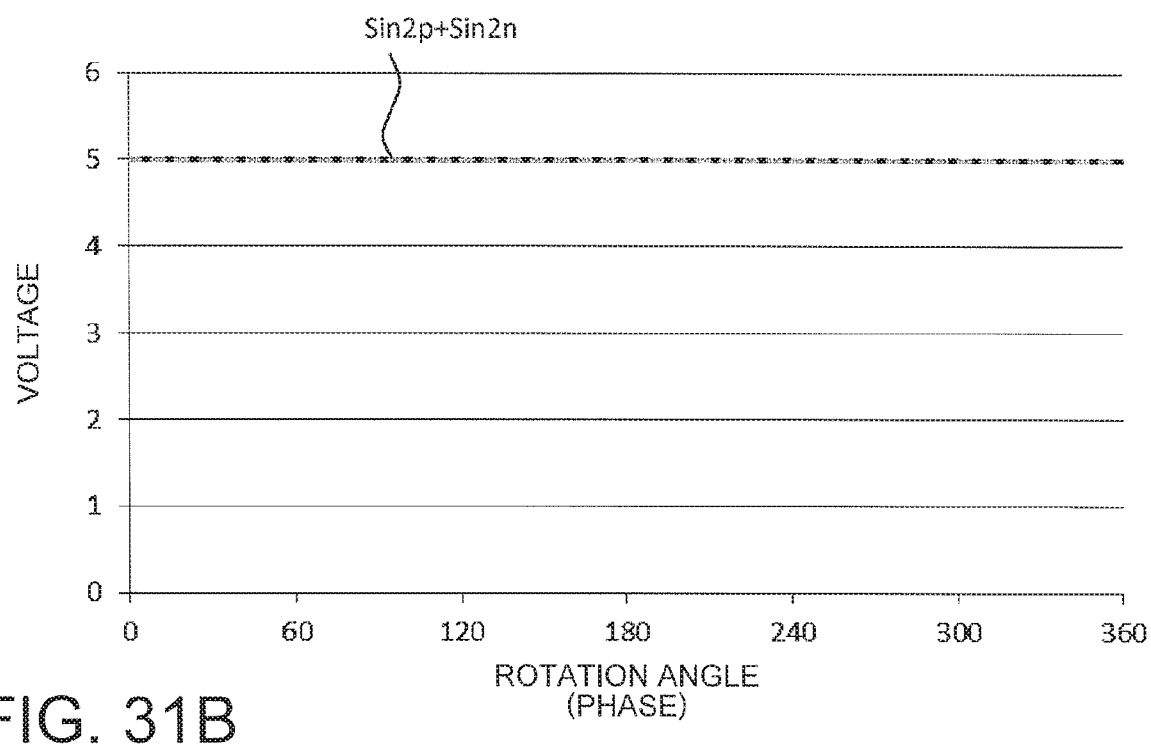
FIG. 31A and FIG. 31B are graphs for showing ideal states of Sin_sum2 and Cos_sum2 of a second angle sensor failure determiner of FIG. 28.

Next, the second angle sensor failure determiner 1102 is described. The sine signal 3 (Sin2p) and the sine signal 4 (Sin2n), which are the output of the second angle sensor 5 and shown in FIG. 3, have a phase difference of 180°, and hence a sum value (Sin_sum2) of the two signals is ideally twice a midpoint voltage as shown in FIG. 31A.

Figure 31B:
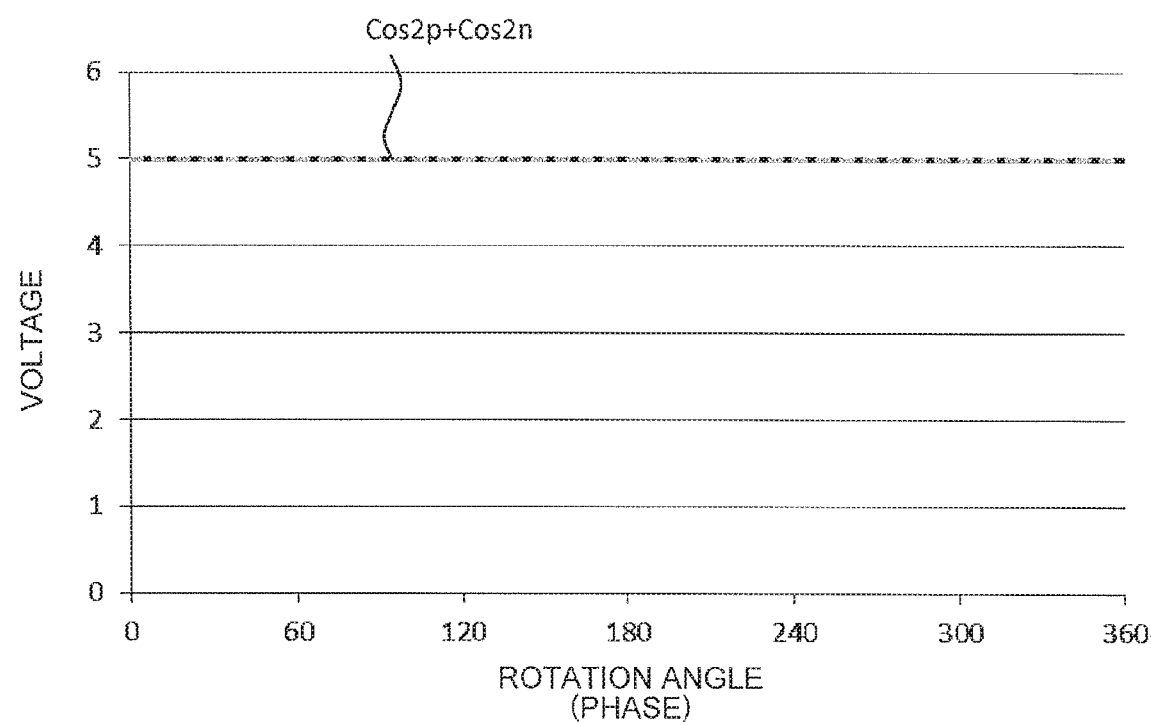

Similarly, the cosine signal 3 (Cos2p) and the cosine signal 4 (Cos1n) have a phase difference of 180°, and hence a sum value (Cos_sum2) of the two signals is ideally twice the midpoint voltage as shown in FIG. 31B.

When any one of the four signals is deviated from the true value due to failure, the sum value Sin_sum2 or the sum value Cos_sum2 is deviated from twice the midpoint voltage. The second angle sensor failure determiner 1102 determines the failure based on the deviation amount. The sum value is slightly fluctuated from twice the midpoint voltage due to circuit variations, temperature change, secular change, and the like, and hence a width is required to be provided as threshold values for the failure determination.

Figure 32:
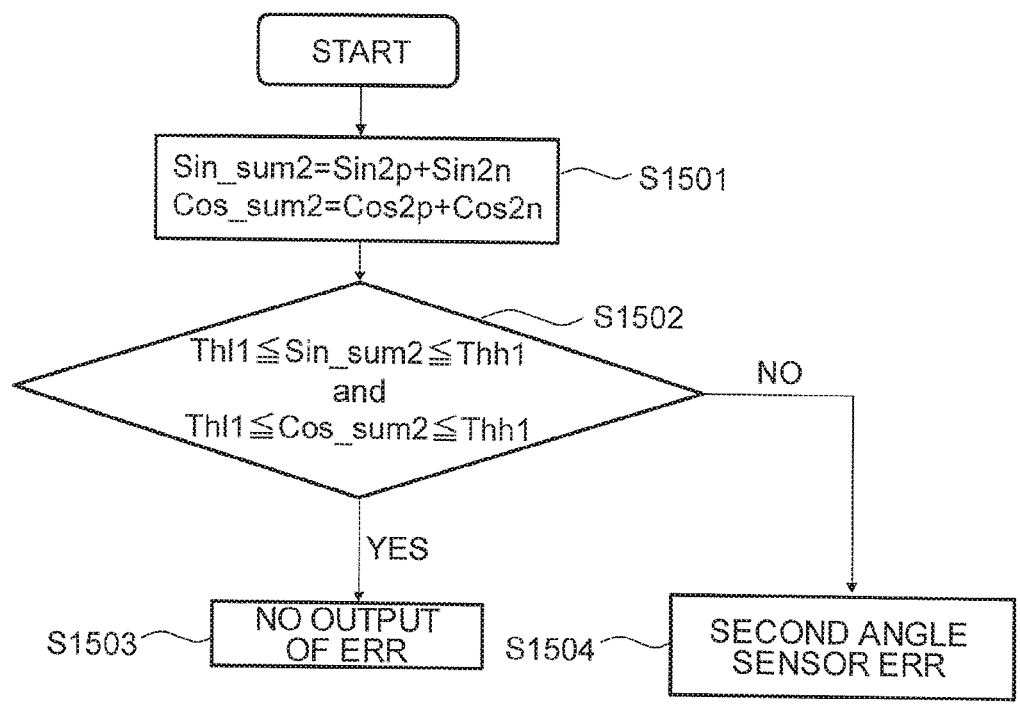
FIG. 32 is a flow chart for illustrating an example of an operation of the second angle sensor failure determiner of FIG. 28.

The second angle sensor failure determiner 1102 determines the failure in accordance with the processing illustrated in a flow chart of FIG. 32.

In Step S1501, the sum value Sin_sum2 is calculated from the sum of the sine signal 3 (Sin2p) and the sine signal 4 (Sin2n), and the sum value Cos_sum2 is calculated from the sum of the cosine signal 3 (Cos2p) and the cosine signal 4 (Cos2n).

In Step S1502, it is determined whether or not the sum value Sin_sum2 is equal to or larger than the lower limit threshold value Thl1 and equal to smaller than the upper limit threshold value Thh1, and further the sum value Cos_sum2 is equal to or larger than the lower limit threshold value Thl1 and equal to or smaller than the upper limit threshold value Thh1. When "YES" is determined, in Step S1503, the ERR signal is not output. When "NO" is determined, in Step S1504, the ERR signal indicating the failure of the second angle sensor 5 is output to the angle sensor failure determiner 15e.

As described above, in the eleventh embodiment, the sum of the sine signals and the sum of the cosine signals are calculated, and an abnormality thereof is detected. In this manner, the failure of the first angle sensor 4 and the second angle sensor 5 can be detected with high accuracy.

The lower limit threshold value Thl1 and the upper limit threshold value Thh1 are values obtained by vertically offsetting the voltage corresponding to twice the midpoint voltage by setting values.

The first angle sensor failure determiner 1101 and the second angle sensor failure determiner 1102 can also be formed of a computer.

Further, the function of the first angle sensor failure determiner 1101 may be provided in the first sine wave signal output device 6. Further, the function of the second angle sensor failure determiner 1102 may be provided in the second sine wave signal output device 7.

Twelfth Embodiment

Figure 33:
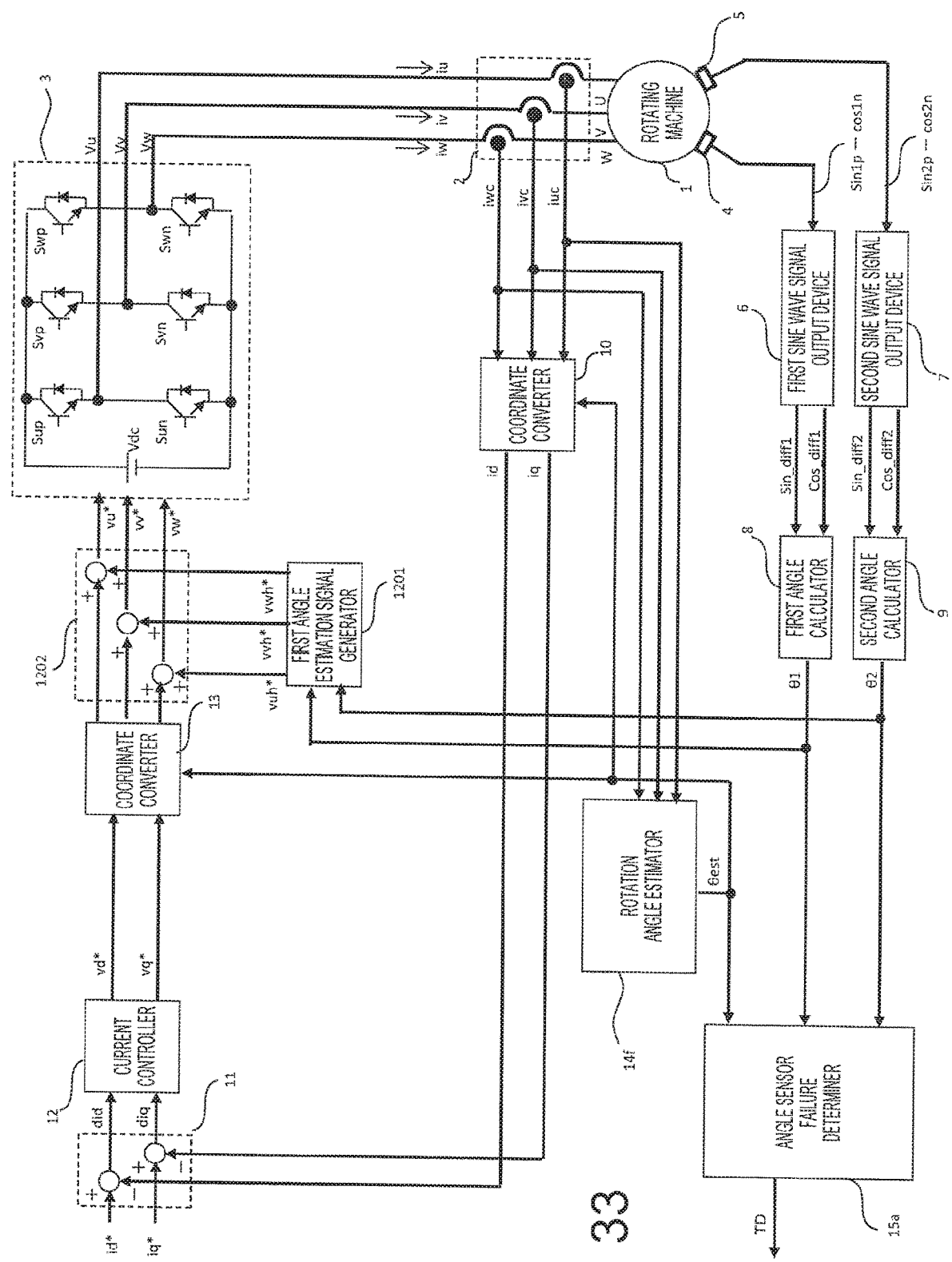
FIG. 33 is a diagram for illustrating an example of a configuration of a rotating machine control device including a failure determination device according to a twelfth embodiment of the present invention.

FIG. 33 is a diagram for illustrating an example of a configuration of a rotating machine control device including a failure determination device according to a twelfth embodiment of the present invention. The twelfth embodiment differs from the above-mentioned embodiments in a first angle estimation signal generator 1201, an adder 1202, and a rotation angle estimator 14f.

Figure 34:
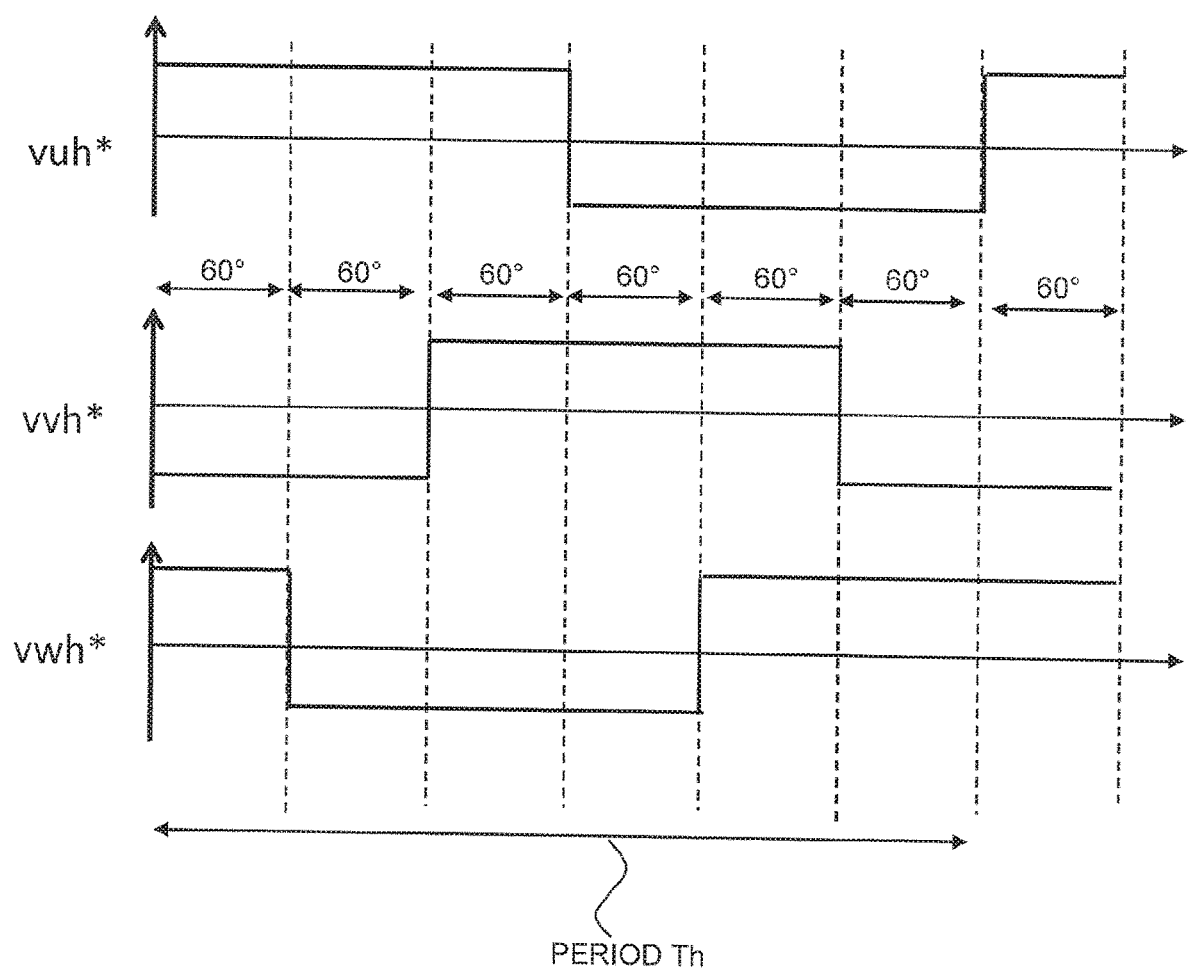
FIG. 34 is a graph for showing output of a first angle estimation signal generator of FIG. 33.

When the difference between the first angle detection value θ1 and the second angle detection value θ2 exceeds a second threshold value Th2, which falls within 90 degrees in electrical angle of the rotating machine 1, as shown in FIG. 34, the first angle estimation signal generator 1201 outputs angle estimation voltage commands vuh*, vvh*, and vwh* at a period Th. The frequency (1/Th) of the angle estimation voltage command is set to be sufficiently higher than an electrical angle frequency corresponding to the rotational speed of the rotating machine 1. Specifically, the frequency (1/Th) is set to be twice or more as large as the electrical angle frequency. When the period Th is set to 360 degrees, vvh* has a phase delay of 120 (60×2) degrees with respect to vuh*, and vwh* has a phase delay of 120 (60×2) degrees with respect to vvh*. Further, the respective amplitudes of vuh*, vvh*, and vwh* are the same.

The adder 1202 outputs values obtained by superimposing the angle estimation voltage commands vuh*, vvh*, and vwh* to the voltage commands being the output of the coordinate converter 13 as the voltage commands vu*, vv*, and vw*.

Figure 35:
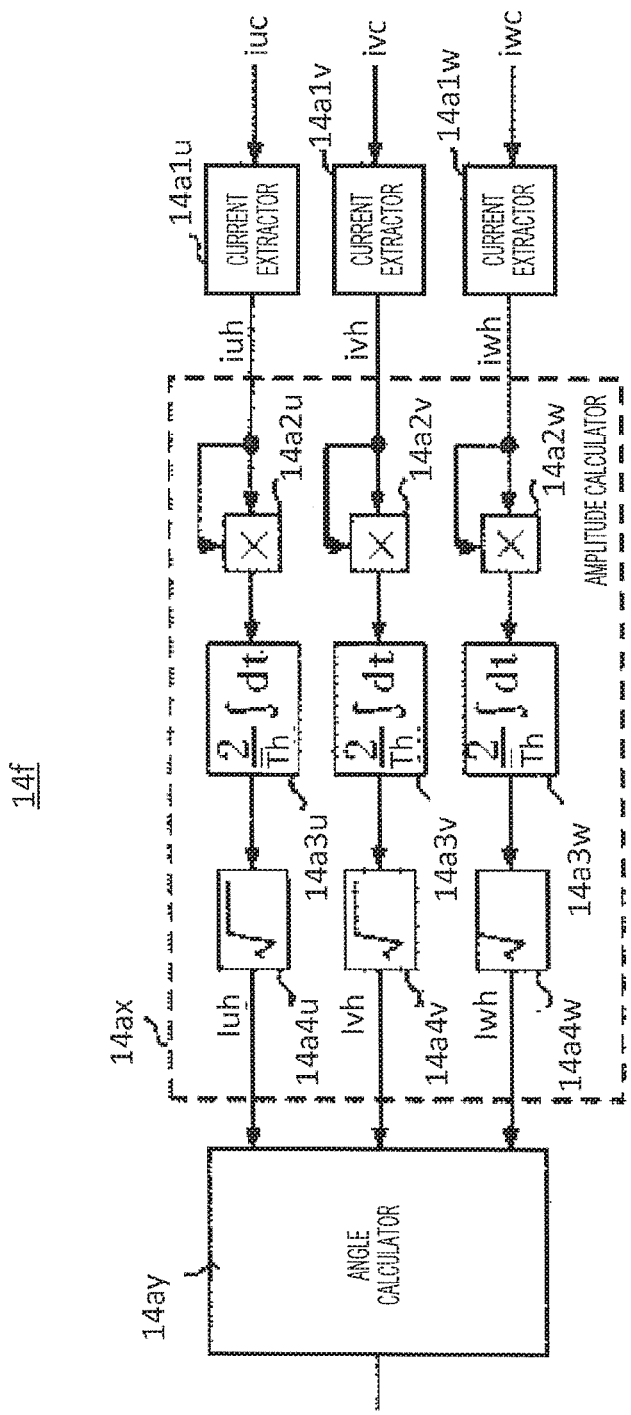
FIG. 35 is a functional block diagram for illustrating an example of a configuration of a rotation angle estimator of FIG. 33.

Subsequently, the rotation angle estimator 14f is described,

FIG. 35 is a functional block diagram for illustrating the configuration of the rotation angle estimator 14f. Now, FIG. 35 is described. The rotation angle estimator 14f includes current extractors 14a1u, 14a1v, and 14a1w, an amplitude calculator 14ax, and an angle calculator 14ay. Further, the amplitude calculator 14ax includes multipliers 14a2u, 14a2v, and 14a2w, integrators 14a3u, 14a3v, and 14a3w, and multipliers 14a4u, 14a4v, and 14a4w.

The angle estimation voltage commands vuh*, vvh*, and vwh* are added to the voltage commands vu*, vv*, and vw* by the adder 1202, and hence the rotating machine phase current detection values iuc, ivc, and iwc of the rotating machine 1 include angle estimation currents iuh, ivh, and iwh having the same frequency component as those of the angle estimation voltage commands, respectively. Therefore, the current extractors 14a1u, 14a1v, and 14a1w respectively extract the angle estimation currents iuh, ivh, and iwh having the same frequency component as those of the angle estimation voltage commands from the rotating machine phase current detection values iuc, ivc, and iwc detected by the current detector 2. Specifically, a band pass filter is used or the rotating machine phase currents iu, iv, and iw are input to a notch filter to attenuate the same frequency component as those of the angle estimation voltage commands vuh*, vvh*, and vwh*, and respective currents obtained after the passage of the notch filter are subtracted from the rotating machine phase currents iu, iv, and iw to extract the angle estimation currents iuh, ivh, and iwh, respectively.

Figure 36:
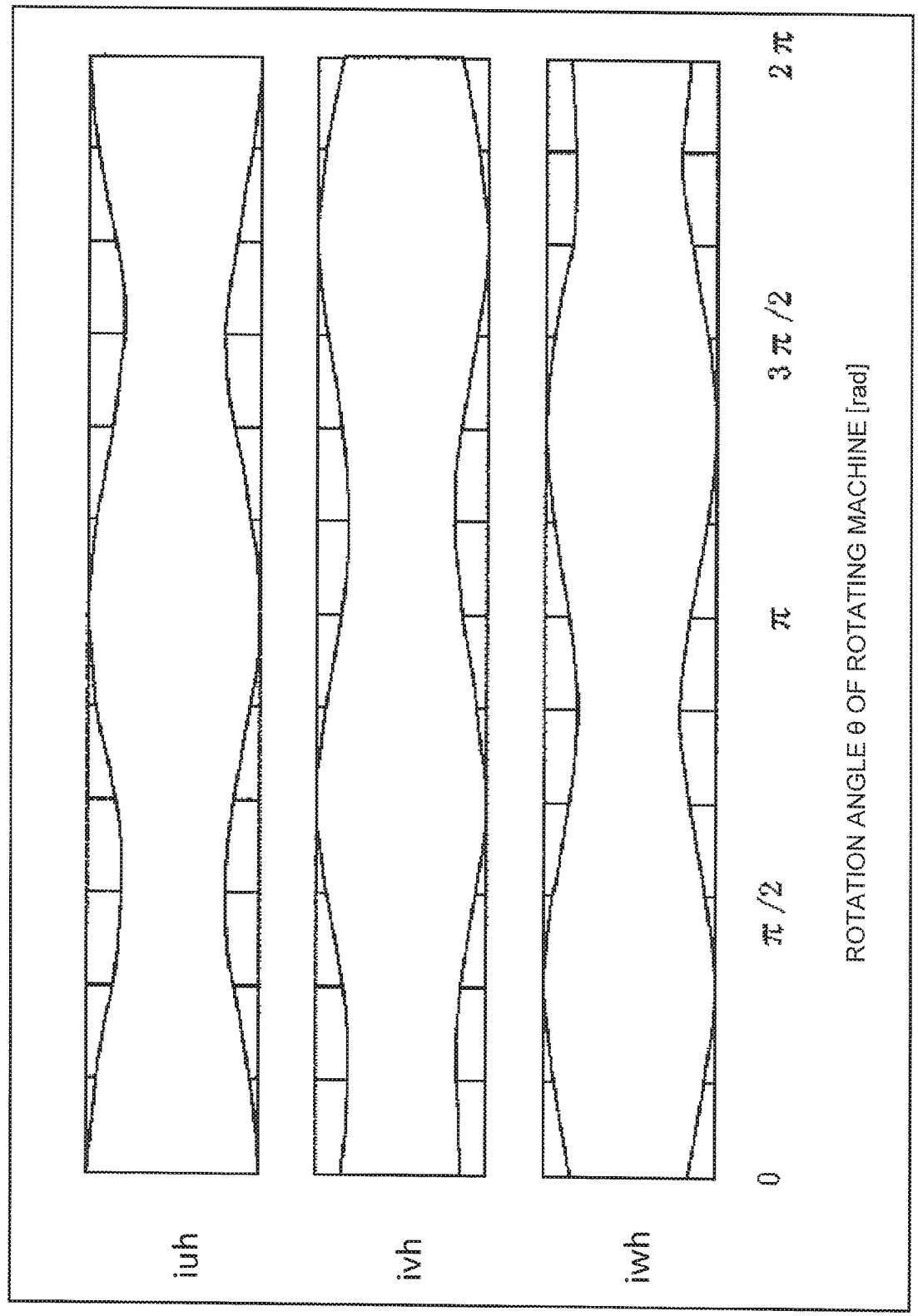
FIG. 36 is a diagram for illustrating angle estimation currents in the twelfth embodiment of the present invention.

When the three-phase AC angle estimation voltage commands vuh*, vvh*, and vwh* as shown in FIG. 34 are applied to the rotating machine 1, the saliency of the rotating machine 1 being the AC rotating machine causes the amplitudes of the angle estimation currents iuh, ivh, and iwh extracted by the current extractors 14a1u, 14a1v, and 14a1w, respectively, to change as a cosine function in accordance with the rotation angle θ of the rotating machine 1 as shown in FIG. 36. This state can be expressed as Expression (11) when expressed as a mathematical expression. Expression (11) includes information on the one rotation angle θ of the rotating machine 1. Therefore, by obtaining the angle estimation currents iuh, ivh, and iwh, the estimation value θest with respect to the rotation angle θ corresponding to the rotational position of the rotating machine 1 can be obtained.

$$i_{uh} = \left\{I_h + \frac{I_{ha}}{2} \cdot \cos(2\theta)\right\} \cdot \sin(\omega_h t) \qquad (11)$$
$$i_{vh} = \left\{I_h + \frac{I_{ha}}{2} \cdot \cos\left\{2\left(\theta + \frac{2\pi}{3}\right)\right\}\right\} \cdot \sin\left(\omega_h t - \frac{2\pi}{3}\right)$$
$$i_{wh} = \left\{I_h + \frac{I_{ha}}{2} \cdot \cos\left\{2\left(\theta - \frac{2\pi}{3}\right)\right\}\right\} \cdot \sin\left(\omega_h t - \frac{4\pi}{3}\right)$$

In Expression (11), symbols are defined as follows.
Ih: average value of amplitudes of angle estimation currents
Iha: change amount of angle estimation current due to rotational position
ωh: angular frequency of angle estimation voltage command Now, a procedure of obtaining amplitudes Iuh, Ivh, and Iwh of the angle estimation currents from the angle estimation currents iuh, ivh, and iwh is described.

In general, it is known that an effective value Ix of an AC current ix having a period Tx is defined by Expression (12).

$$I_x = \sqrt{\frac{1}{T_x} \int_0^{T_x} i_x^2 dt} \qquad (12)$$

That is, the effective value Ix is obtained by squaring the instantaneous value ix of the AC current, integrating the result for one period Tx, multiplying the result by 1/Tx, and then obtaining the square root thereof. Further, an amplitude Ixamp of the AC current ix is obtained by Expression (13) with use of the effective value Ix.

$$I_{xamp} = \sqrt{2} I_x = \sqrt{\frac{2}{T_x} \int_0^{T_x} i_x^2 dt} \qquad (13)$$

Therefore, also in the amplitude calculator 14ax, the angle estimation currents iuh, ivh, and iwh are squared by the multipliers 14a2u, 14a2v, and 14a2w, respectively, the values of the squares of the angle estimation currents iuh, ivh, and iwh are integrated at the period Th by the integrators 14a3u, 14a3v, and 14a3w, respectively, and then multiplication calculation of 2/Th is performed. The results are subjected to square root calculation by the multipliers 14a4u, 14a4v, and 14a4w. In this manner, the amplitudes Iuh, Ivh, and Iwh of the angle estimation currents are calculated.

Figure 37:
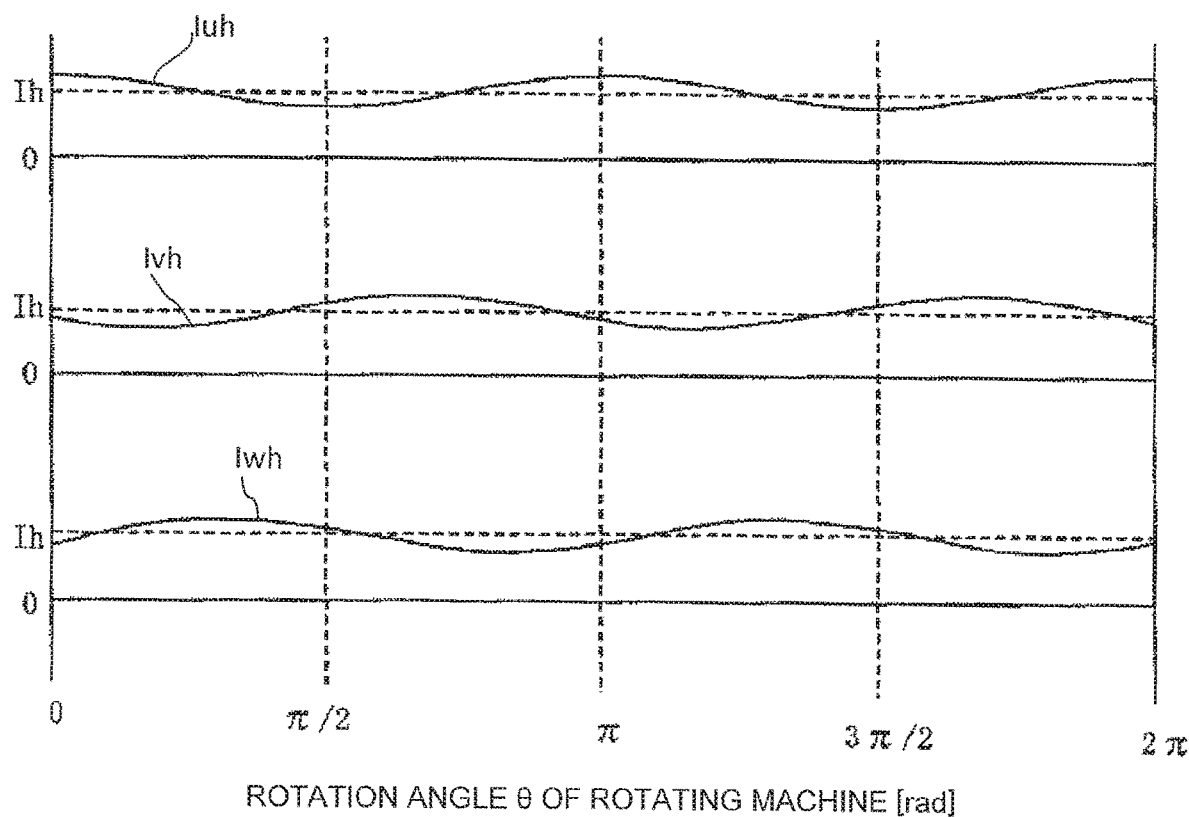
FIG. 37 is a graph for showing amplitudes of position estimation currents obtained by an amplitude calculator of FIG. 35.
Figure 38:
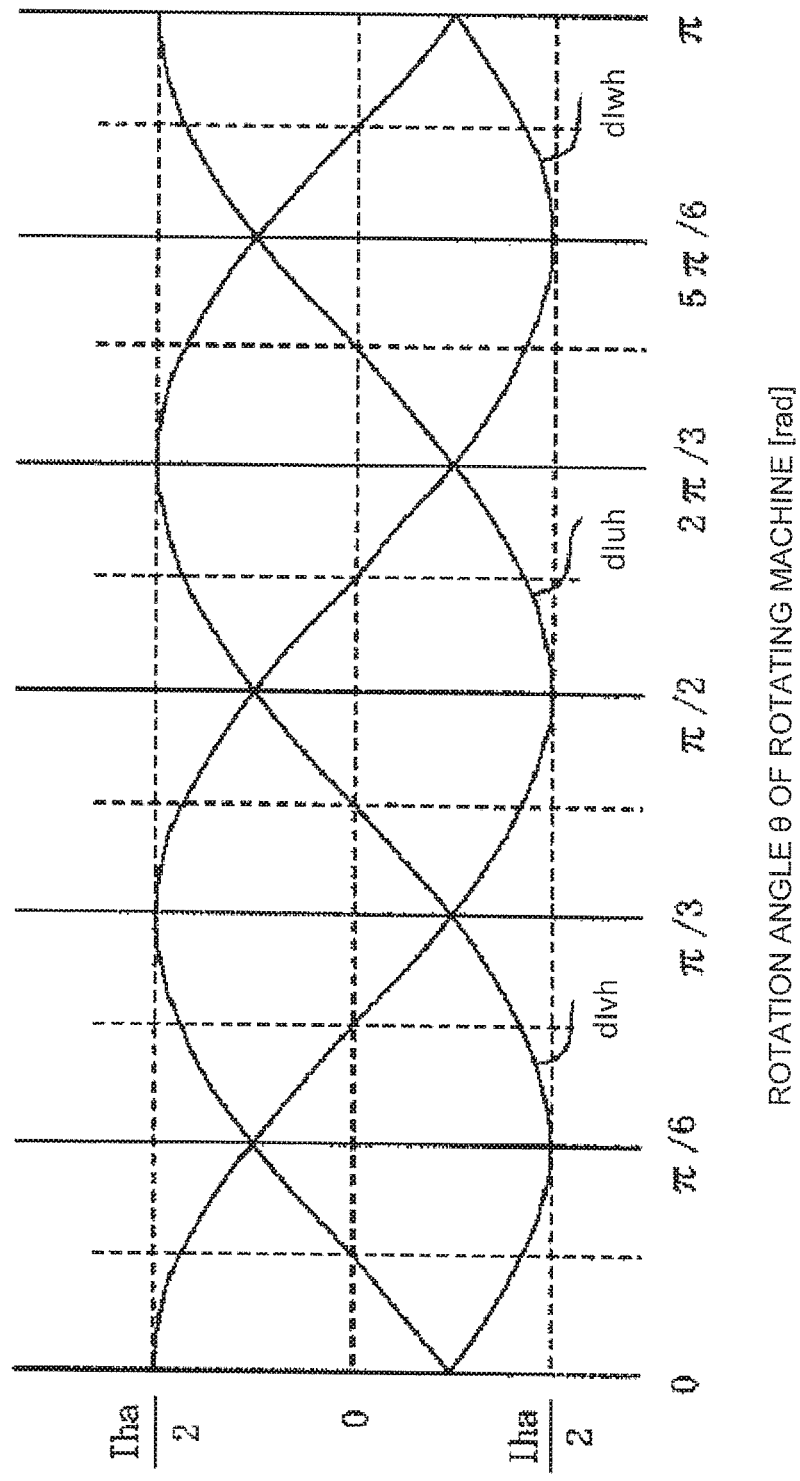
FIG. 38 is a graph for showing position calculation signals in the twelfth embodiment of the present invention.

The amplitudes Iuh, Ivh, and Iwh of the position estimation currents obtained by the amplitude calculator 14ax have an offset Ih superimposed thereon as shown in FIG. 37, and change at a ½ period of the rotation angle θ of the rotating machine 1 being the AC rotating machine. In view of this, first, as in Expression (14), the angle calculator 14ay subtracts the offset Ih from the amplitudes Iuh, Ivh, and Iwh of the angle estimation currents to calculate respective position calculation signals dIuh, dIvh, and dIwh. As described above, suffix 1 is added in the expression. In this case, the offset Ih can be obtained by Expression (15) based on the fact that the amplitudes Iuh, Ivh, and Iwh of the position estimation currents exhibit triphase equilibrium. The respective position calculation signals dIuh, dIvh, and dIwh become balanced three-phase alternating currents that have no offset with respect to the rotation angle θ of the rotating machine 1 as shown in FIG. 38. Therefore, by subjecting at least one of the position calculation signals dIuh, dIvh, and dIwh to inverse cosine calculation, the rotation angle estimation value θest of the rotational position θ can be calculated. Alternatively, the rotation angle estimation value θest of the rotational position θ may be obtained from Expression (16) based on the position calculation signals dIuh, dIvh, and dIwh.

$$dI_{uh} = I_{uh} + I_h = \frac{I_{ha}}{2} \cdot \cos(2\theta) \qquad (14)$$
$$dI_{vh} = I_{vh} + I_h = \frac{I_{ha}}{2} \cdot \cos\left\{2\left(\theta + \frac{2\pi}{3}\right)\right\}$$
$$dI_{wh} = I_{wh} + I_h = \frac{I_{ha}}{2} \cdot \cos\left\{2\left(\theta - \frac{2\pi}{3}\right)\right\}$$

$$I_h = \frac{I_{uh} + I_{vh} + I_{wh}}{3} \qquad (15)$$

$$\theta_{est} = \frac{1}{2} \operatorname{atan}\left(\frac{\frac{\sqrt{3}}{2}(dI_{vh} - dI_{wh})}{dI_{uh} - 0.5 dI_{vh} - 0.5 dI_{wh}}\right) \qquad (16)$$

As described above, according to the twelfth embodiment, when the difference between the first angle detection value θ1 and the second angle detection value θ2 exceeds the second threshold value, the rotation angle estimation value θest is calculated by superimposing the angle estimation voltage commands on the voltage commands obtained by the coordinate converter 13 to extract the components of the angle estimation voltage commands in the rotating machine currents. In view of noise reduction of the rotating machine 1, it is not preferred to add the angle estimation voltage commands, but when the difference between the first angle detection value θ1 and the second angle detection value θ2 is increased, this is an abnormal state in which at least one of the first angle sensor 4 or the second angle sensor 5 is out of order at high possibility. In such a case, in consideration of safety rather than noise reduction, the angle estimation voltage commands are superimposed on the voltage commands so that the rotation angle estimation value θest can be calculated at high accuracy. Thus, the angle sensor failure determiner can quickly detect the angle sensor that is out of order, and the safety and reliability are improved.

The first angle estimation signal generator 1201, the adder 1202, and the rotation angle estimator 14f can also be formed of a computer.

The present invention is not limited to each of the above-mentioned embodiments, and includes all possible combinations of those embodiments.

INDUSTRIAL APPLICABILITY

The failure determination device and method according to the present invention can be applied to a rotating machine control device of various fields.

The invention claimed is:

1. A failure determination device for a rotating machine control device, the failure determination device comprising:
   a power converter to supply power to a rotating machine;
   a current detector to detect a rotating machine current to be supplied to the rotating machine;
   a first angle sensor to generate at least two electrical signals in accordance with a rotation angle of the rotating machine;
   a first sine wave signal output device to output a first sine wave signal and a second sine wave signal based on the at least two electrical signals generated by the first angle sensor;
   a first angle calculator to output a first angle detection value based on the first sine wave signal and the second sine wave signal;
   a second angle sensor to generate at least two electrical signals in accordance with the rotation angle of the rotating machine;
   a second sine wave signal output device to output a third sine wave signal and a fourth sine wave signal based on the at least two electrical signals generated by the second angle sensor;
   a second angle calculator to output a second angle detection value based on the third sine wave signal and the fourth sine wave signal;
   a rotation angle estimator to output a rotation angle estimation value with respect to the rotation angle of the rotating machine based on the rotating machine current;
   an angle sensor failure determiner to detect failure of the first angle sensor and the second angle sensor; and
   a power converter failure detector to detect failure of the power converter,
   wherein the angle sensor failure determiner determines the failure of the first angle sensor or the second angle sensor based on at least two of:
      a difference between the rotation angle estimation value and the first angle detection value;
      a difference between the rotation angle estimation value and the second angle detection value; and
      a difference between the first angle detection value and the second angle detection value, and
   wherein the angle sensor failure determiner determines the failure of the first angle sensor or the second angle sensor when the power converter failure detector does not detect the failure of the power converter.

2. The failure determination device for a rotating machine control device according to claim 1,
   wherein the power converter includes a multi-phase inverter including a plurality of switching elements, and
   wherein the power converter failure detector determines the failure of the power converter based on a potential difference at an output terminal of each of the plurality of switching elements exhibited when a signal for achieving conduction of the each of the plurality of switching elements is output to an input terminal of the each of the plurality of switching elements.

3. The failure determination device for a rotating machine control device according to claim 1, further comprising a current detector abnormality determiner to detect failure of the current detector based on the rotating machine current,
   wherein the angle sensor failure determiner determines the failure of the first angle sensor or the second angle sensor when the current detector abnormality determiner does not detect the failure of the current detector.

4. The failure determination device for a rotating machine control device according to claim 2, further comprising a current detector abnormality determiner to detect failure of the current detector based on the rotating machine current,
   wherein the angle sensor failure determiner determines the failure of the first angle sensor or the second angle sensor when the current detector abnormality determiner does not detect the failure of the current detector.

5. The failure determination device for a rotating machine control device according to claim 1,
   wherein the first sine wave signal output device outputs a signal indicating determination of the failure of the first angle sensor to the angle sensor failure determiner based on a first sum of squares obtained by squaring and then adding the first sine wave signal and the second sine wave signal or a square root of the first sum of squares, and
   wherein the second sine wave signal output device outputs a signal indicating determination of the failure of the second angle sensor to the angle sensor failure determiner based on a second sum of squares obtained by squaring and then adding the third sine wave signal and the fourth sine wave signal or a square root of the second sum of squares.

6. The failure determination device for a rotating machine control device according to claim 1,
   wherein the first sine wave signal output device outputs a signal indicating determination of the failure of the first angle sensor to the angle sensor failure determiner based on a first sum of squares obtained by squaring and then adding the first sine wave signal and the second sine wave signal or a square root of the first sum of squares, and
   wherein the second sine wave signal output device outputs a signal indicating determination of the failure of the second angle sensor to the angle sensor failure determiner based on a second sum of squares obtained by squaring and then adding the third sine wave signal and the fourth sine wave signal or a square root of the second sum of squares.

7. The failure determination device for a rotating machine control device according to claim 2,
   wherein the first sine wave signal output device outputs a signal indicating determination of the failure of the first angle sensor to the angle sensor failure determiner based on a first sum of squares obtained by squaring and then adding the first sine wave signal and the second sine wave signal or a square root of the first sum of squares, and
   wherein the second sine wave signal output device outputs a signal indicating determination of the failure of the second angle sensor to the angle sensor failure determiner based on a second sum of squares obtained by squaring and then adding the third sine wave signal and the fourth sine wave signal or a square root of the second sum of squares.

8. The failure determination device for a rotating machine control device according to claim 1,
wherein the first angle sensor outputs:
a first electrical signal, which changes in a shape of a sine wave in accordance with the rotation angle of the rotating machine;
a second electrical signal having a phase that is different by 180 degrees from a phase of the first electrical signal;
a third electrical signal having a phase that is different by 90 degrees from the phase of the first electrical signal; and
a fourth electrical signal having a phase that is different by 180 degrees from the phase of the third electrical signal,
wherein the first sine wave signal output device outputs a signal indicating determination of the failure of the first angle sensor to the angle sensor failure determiner based on a sum of the first electrical signal and the second electrical signal or a sum of the third electrical signal and
wherein the second angle sensor outputs:
a fifth electrical signal, which changes in a shape of a sine wave in accordance with the rotation angle of the rotating machine;
a sixth electrical signal having a phase that is different by 180 degrees from a phase of the fifth electrical signal;
a seventh electrical signal having a phase that is different by 90 degrees from the phase of the fifth electrical signal; and
an eighth electrical signal having a phase that is different by 180 degrees from the phase of the seventh electrical signal, and
wherein the second sine wave signal output device outputs a signal indicating determination of the failure of the second angle sensor to the angle sensor failure determiner based on a sum of the fifth electrical signal and the sixth electrical signal or a sum of the seventh electrical signal and the eighth electrical signal.

9. The failure determination device for a rotating machine control device according to claim 2,
wherein the first angle sensor outputs:
a first electrical signal, which changes in a shape of a sine wave in accordance with the rotation angle of the rotating machine;
a second electrical signal having a phase that is different by 180 degrees from a phase of the first electrical signal;
a third electrical signal having a phase that is different by 90 degrees from the phase of the first electrical signal; and
a fourth electrical signal having a phase that is different by 180 degrees from the phase of the third electrical signal,
wherein the first sine wave signal output device outputs a signal indicating determination of the failure of the first angle sensor to the angle sensor failure determiner based on a sum of the first electrical signal and the second electrical signal or a sum of the third electrical signal and the fourth electrical signal,
wherein the second angle sensor is configured to output:
a fifth electrical signal, which changes in a shape of a sine wave in accordance with the rotation angle of the rotating machine;
a sixth electrical signal having a phase that is different by 180 degrees from a phase of the fifth electrical signal;
a seventh electrical signal having a phase that is different by 90 degrees from the phase of the fifth electrical signal; and
an eighth electrical signal having a phase that is different by 180 degrees from the phase of the seventh electrical signal, and
wherein the second sine wave signal output device outputs a signal indicating determination of the failure of the second angle sensor to the angle sensor failure determiner based on a sum of the fifth electrical signal and the sixth electrical signal or a sum of the seventh electrical signal and the eighth electrical signal.

10. A failure determination device for a rotating machine control device, the failure determination device comprising:
a power converter to supply power to a rotating machine;
a current detector to detect a rotating machine current to be supplied to the rotating machine;
a first angle sensor to generate at least two electrical signals in accordance with a rotation angle of the rotating machine;
a first sine wave signal output device to output a first sine wave signal and a second sine wave signal based on the at least two electrical signals generated by the first angle sensor;
a first angle calculator to output a first angle detection value based on the first sine wave signal and the second sine wave signal;
a second angle sensor to generate at least two electrical signals in accordance with the rotation angle of the rotating machine;
a second sine wave signal output device to output a third sine wave signal and a fourth sine wave signal based on the at least two electrical signals generated by the second angle sensor;
a second angle calculator to output a second angle detection value based on the third sine wave signal and the fourth sine wave signal;
a rotation angle estimator to output a rotation angle estimation value with respect to the rotation angle of the rotating machine based on the rotating machine current an angle sensor failure determiner to detect failure of the first angle sensor and the second angle sensor; and
a current detector abnormality determiner to detect failure of the current detector based on the rotating machine current,
wherein the angle sensor failure determiner determines the failure of the first angle sensor or the second angle sensor based on at least two of:
a difference between the rotation angle estimation value and the first angle detection value;
a difference between the rotation angle estimation value and the second angle detection value; and
a difference between the first angle detection value and the second angle detection value, and
wherein the angle sensor failure determiner determines the failure of the first angle sensor or the second angle sensor when the current detector abnormality determiner does not detect the failure of the current detector.

11. The failure determination device for a rotating machine control device according to claim 1, further comprising an angle estimation signal generator to output, when a difference between the first angle detection value and the second angle detection value exceeds a threshold value that falls within 90 degrees in electrical angle of the rotating machine, an angle estimation voltage command, which is to be superimposed on a voltage command to the power converter, and has a frequency that is different from a frequency of a voltage for driving the rotating machine, wherein the rotation angle estimator further calculates the rotation angle estimation value by extracting a frequency component of the angle estimation voltage command from the rotating machine current.

12. The failure determination device for a rotating machine control device according to claim 1, further comprising an angle estimation signal generator to output, when a difference between the first angle detection value and the second angle detection value exceeds a threshold value that falls within 90 degrees in electrical angle of the rotating machine, an angle estimation voltage command, which is to be superimposed on a voltage command to the power converter, and has a frequency that is different from a frequency of a voltage for driving the rotating machine, wherein the rotation angle estimator calculates the rotation angle estimation value by extracting a frequency component of the angle estimation voltage command from the rotating machine current.

13. The failure determination device for a rotating machine control device according to claim 2, further comprising an angle estimation signal generator to output, when a difference between the first angle detection value and the second angle detection value exceeds a threshold value that falls within 90 degrees in electrical angle of the rotating machine, an angle estimation voltage command, which is to be superimposed on a voltage command to the power converter, and has a frequency that is different from a frequency of a voltage for driving the rotating machine, wherein the rotation angle estimator calculates the rotation angle estimation value by extracting a frequency component of the angle estimation voltage command from the rotating machine current.

14. The failure determination device for a rotating machine control device according to claim 10, wherein the first angle sensor outputs:
  a first electrical signal, which changes in a shape of a sine wave in accordance with the rotation angle of the rotating machine;
  a second electrical signal having a phase that is different by 180 degrees from a phase of the first electrical signal;
  a third electrical signal having a phase that is different by 90 degrees from the phase of the first electrical signal; and
  a fourth electrical signal having a phase that is different by 180 degrees from the phase of the third electrical signal, wherein the first sine wave signal output device outputs a signal indicating determination of the failure of the first angle sensor to the angle sensor failure determiner based on a sum of the first electrical signal and the second electrical signal or a sum of the third electrical signal and the fourth electrical signal, wherein the second angle sensor outputs:
  a fifth electrical signal, which changes in a shape of a sine wave in accordance with the rotation angle of the rotating machine;
  a sixth electrical signal having a phase that is different by 180 degrees from a phase of the fifth electrical signal;
  a seventh electrical signal having a phase that is different by 90 degrees from the phase of the fifth electrical signal; and
  an eighth electrical signal having a phase that is different by 180 degrees from the phase of the seventh electrical signal, and wherein the second sine wave signal output device outputs a signal indicating determination of the failure of the second angle sensor to the angle sensor failure determiner based on a sum of the fifth electrical signal and the sixth electrical signal or a sum of the seventh electrical signal and the eighth electrical signal.

15. The failure determination device for a rotating machine control device according to claim 10, wherein the first sine wave signal output device outputs a signal indicating determination of the failure of the first angle sensor to the angle sensor failure determiner based on a first sum of squares obtained by squaring and then adding the first sine wave signal and the second sine wave signal or a square root of the first sum of squares, and wherein the second sine wave signal output device outputs a signal indicating determination of the failure of the second angle sensor to the angle sensor failure determiner based on a second sum of squares obtained by squaring and then adding the third sine wave signal and the fourth sine wave signal or a square root of the second sum of squares.

16. The failure determination device for a rotating machine control device according to claim 10, further comprising an angle estimation signal generator to output, when a difference between the first angle detection value and the second angle detection value exceeds a threshold value that falls within 90 degrees in electrical angle of the rotating machine, an angle estimation voltage command, which is to be superimposed on a voltage command to the power converter, and has a frequency that is different from a frequency of a voltage for driving the rotating machine, wherein the rotation angle estimator calculates the rotation angle estimation value by extracting a frequency component of the angle estimation voltage command from the rotating machine current.

17. A failure determination method for a rotating machine control device adjusting power to be supplied from a power converter to control a rotating machine, the failure determination method comprising:

generating a first sine wave signal and a second sine wave signal based on at least two electrical signals generated by a first angle sensor in accordance with a rotation angle of the rotating machine;

generating a first angle detection value based on the first sine wave signal and the second sine wave signal;

generating a third sine wave signal and a fourth sine wave signal based on at least two electrical signals generated by a second angle sensor in accordance with the rotation angle of the rotating machine;

generating a second angle detection value based on the third sine wave signal and the fourth sine wave signal;

obtaining a rotation angle estimation value with respect to the rotation angle of the rotating machine based on a rotating machine current to be supplied to the rotating machine, which is detected by a current detector;

detecting failure of the power converter based on a power converter failure detector;

detecting failure of the first angle sensor or the second angle sensor based on at least two of:
a difference between the rotation angle estimation value and the first angle detection value;
a difference between the rotation angle estimation value and the second angle detection value; and
a difference between the first angle detection value and the second angle detection value; and
detecting the failure of the first angle sensor or the second angle sensor when the power converter failure detector does not detect the failure of the power converter.

\* \* \* \* \*